United States Patent
Kannan et al.

(10) Patent No.: US 10,216,420 B1
(45) Date of Patent: Feb. 26, 2019

(54) CALIBRATION OF FLASH CHANNELS IN SSD

(71) Applicant: Pure Storage, Inc., Mountain View, CA (US)

(72) Inventors: Hari Kannan, Mountain View, CA (US); Nenad Miladinovic, Mountain View, CA (US); Zhangxi Tan, Mountain View, CA (US); Randy Zhao, Mountain View, CA (US)

(73) Assignee: Pure Storage, Inc., Mountain View, CA (US)

( * ) Notice: Subject to any disclaimer, the term of this patent is extended or adjusted under 35 U.S.C. 154(b) by 147 days.

(21) Appl. No.: 15/338,052

(22) Filed: Oct. 28, 2016

Related U.S. Application Data

(60) Provisional application No. 62/366,081, filed on Jul. 24, 2016.

(51) Int. Cl.
*G06F 3/06* (2006.01)
*G11C 29/52* (2006.01)
(Continued)

(52) U.S. Cl.
CPC ............ *G06F 3/061* (2013.01); *G06F 3/0619* (2013.01); *G06F 3/0656* (2013.01);
(Continued)

(58) Field of Classification Search
CPC ....................................................... G06F 3/061
(Continued)

(56) References Cited

U.S. PATENT DOCUMENTS

| 5,390,327 A | 2/1995 | Lubbers et al. |
| 5,479,653 A | 12/1995 | Jones |

(Continued)

FOREIGN PATENT DOCUMENTS

| EP | 2164006 | 3/2010 |
| EP | 2256621 | 12/2010 |

(Continued)

OTHER PUBLICATIONS

Wong, Theodore M., et al., "Verifiable secret redistribution for archive systems," In: Proceedings on First International IEEE Security in Storage Workshop 2002, (SISW '02), pp. 1-12, Dec. 11, 2002.

(Continued)

*Primary Examiner* — Kamini B Patel
(74) *Attorney, Agent, or Firm* — Womble Bond Dickinson (US) LLP

(57) ABSTRACT

A method for communicating with memory, performed by a memory controller, is provided. The method includes sampling reads from a plurality of memory devices and storing first calibration points in first buffers, based on the sampling, with at least one first calibration point and corresponding first buffer for each of the plurality of memory devices. The method includes sampling a read from a second memory device in background while performing a read from a first memory device using the first calibration point in the first buffer corresponding to the first memory device. The method includes storing a second calibration point in a second buffer, for the second memory device, based on the sampling in the background, with the first buffer for the second memory device having the first calibration point used for ongoing reads of the second memory device.

17 Claims, 15 Drawing Sheets

(51) Int. Cl.
*G11C 16/34* (2006.01)
*G06F 11/07* (2006.01)
*H03M 13/15* (2006.01)

(52) U.S. Cl.
CPC ........ *G06F 3/0688* (2013.01); *G06F 11/0727* (2013.01); *G06F 11/0751* (2013.01); *G06F 11/0793* (2013.01); *G11C 16/3495* (2013.01); *G11C 29/52* (2013.01); *H03M 13/154* (2013.01)

(58) Field of Classification Search
USPC .......................................................... 714/22
See application file for complete search history.

(56) References Cited

U.S. PATENT DOCUMENTS

| | | |
|---|---|---|
| 5,649,093 A | 7/1997 | Hanko et al. |
| 5,764,767 A | 6/1998 | Beimel et al. |
| 6,182,214 B1 | 1/2001 | Hardjono |
| 6,275,898 B1 | 8/2001 | DeKoning |
| 6,535,417 B2 | 3/2003 | Tsuda |
| 6,643,748 B1 | 11/2003 | Wieland |
| 6,725,392 B1 | 4/2004 | Frey et al. |
| 6,836,816 B2 | 12/2004 | Kendall |
| 6,985,995 B2 | 1/2006 | Holland et al. |
| 7,032,125 B2 | 4/2006 | Holt et al. |
| 7,051,155 B2 | 5/2006 | Talagala et al. |
| 7,065,617 B2 | 6/2006 | Wang |
| 7,069,383 B2 | 6/2006 | Yamamoto et al. |
| 7,076,606 B2 | 7/2006 | Orsley |
| 7,107,480 B1 | 9/2006 | Moshayedi et al. |
| 7,159,150 B2 | 1/2007 | Kenchammana-Hosekote et al. |
| 7,162,575 B2 | 1/2007 | Dalal et al. |
| 7,164,608 B2 | 1/2007 | Lee |
| 7,334,156 B2 | 2/2008 | Land et al. |
| 7,370,220 B1 | 5/2008 | Nguyen et al. |
| 7,424,498 B1 | 9/2008 | Patterson |
| 7,424,592 B1 | 9/2008 | Karr |
| 7,444,532 B2 | 10/2008 | Masuyama et al. |
| 7,480,658 B2 | 1/2009 | Heinla et al. |
| 7,536,506 B2 | 5/2009 | Ashmore et al. |
| 7,558,859 B2 | 7/2009 | Kasiolas |
| 7,565,446 B2 | 7/2009 | Talagala et al. |
| 7,613,947 B1 | 11/2009 | Coatney |
| 7,681,104 B1 | 3/2010 | Sim-Tang et al. |
| 7,681,105 B1 | 3/2010 | Sim-Tang et al. |
| 7,730,258 B1 | 6/2010 | Smith |
| 7,743,276 B2 | 6/2010 | Jacobsen et al. |
| 7,757,038 B2 | 7/2010 | Kitahara |
| 7,778,960 B1 | 8/2010 | Chatterjee et al. |
| 7,814,272 B2 | 10/2010 | Barrall et al. |
| 7,814,273 B2 | 10/2010 | Barrall et al. |
| 7,818,531 B2 | 10/2010 | Barrall et al. |
| 7,827,351 B2 | 11/2010 | Suetsugu et al. |
| 7,827,439 B2 | 11/2010 | Matthew et al. |
| 7,870,105 B2 | 1/2011 | Arakawa et al. |
| 7,885,938 B1 | 2/2011 | Greene et al. |
| 7,886,111 B2 | 2/2011 | Klemm et al. |
| 7,908,448 B1 | 3/2011 | Chatterjee et al. |
| 7,916,538 B2 | 3/2011 | Jeon et al. |
| 7,941,697 B2 | 5/2011 | Mathew et al. |
| 7,958,303 B2 | 6/2011 | Shuster |
| 7,971,129 B2 | 6/2011 | Watson |
| 7,991,822 B2 | 8/2011 | Bish et al. |
| 8,010,485 B1 | 8/2011 | Chatterjee et al. |
| 8,010,829 B1 | 8/2011 | Chatterjee et al. |
| 8,020,047 B2 | 9/2011 | Courtney |
| 8,046,548 B1 | 10/2011 | Chatterjee et al. |
| 8,051,361 B2 | 11/2011 | Sim-Tang et al. |
| 8,051,362 B2 | 11/2011 | Li et al. |
| 8,082,393 B2 | 12/2011 | Galloway et al. |
| 8,086,634 B2 | 12/2011 | Mimatsu |
| 8,086,911 B1 | 12/2011 | Taylor |
| 8,090,837 B2 | 1/2012 | Shin et al. |
| 8,108,502 B2 | 1/2012 | Tabbara et al. |
| 8,117,388 B2 | 2/2012 | Jernigan, IV |
| 8,140,821 B1 | 3/2012 | Raizen et al. |
| 8,145,736 B1 | 3/2012 | Tewari et al. |
| 8,145,838 B1 | 3/2012 | Miller et al. |
| 8,145,840 B2 | 3/2012 | Koul et al. |
| 8,176,360 B2 | 5/2012 | Frost et al. |
| 8,180,855 B2 | 5/2012 | Aiello et al. |
| 8,200,922 B2 | 6/2012 | McKean et al. |
| 8,225,006 B1 | 7/2012 | Karamcheti |
| 8,239,618 B2 | 8/2012 | Kotzur et al. |
| 8,244,999 B1 | 8/2012 | Chatterjee et al. |
| 8,305,811 B2 | 11/2012 | Jeon |
| 8,315,999 B2 | 11/2012 | Chatley et al. |
| 8,327,080 B1 | 12/2012 | Der |
| 8,351,290 B1 | 1/2013 | Huang et al. |
| 8,375,146 B2 | 2/2013 | Sinclair |
| 8,397,016 B2 | 3/2013 | Talagala et al. |
| 8,402,152 B2 | 3/2013 | Duran |
| 8,412,880 B2 | 4/2013 | Leibowitz et al. |
| 8,423,739 B2 | 4/2013 | Ash et al. |
| 8,429,436 B2 | 4/2013 | Filingim et al. |
| 8,473,778 B2 | 6/2013 | Simitci |
| 8,479,037 B1 | 7/2013 | Chatterjee et al. |
| 8,498,967 B1 | 7/2013 | Chatterjee et al. |
| 8,522,073 B2 | 8/2013 | Cohen |
| 8,533,527 B2 | 9/2013 | Daikokuya et al. |
| 8,544,029 B2 | 9/2013 | Bakke et al. |
| 8,549,224 B1 * | 10/2013 | Zeryck .................... G06F 3/061 711/114 |
| 8,589,625 B2 | 11/2013 | Colgrove et al. |
| 8,595,455 B2 | 11/2013 | Chatterjee et al. |
| 8,615,599 B1 | 12/2013 | Takefman et al. |
| 8,627,136 B2 | 1/2014 | Shankar et al. |
| 8,627,138 B1 | 1/2014 | Clark |
| 8,660,131 B2 | 2/2014 | Vermunt et al. |
| 8,661,218 B1 | 2/2014 | Piszczek et al. |
| 8,700,875 B1 | 4/2014 | Barron et al. |
| 8,706,694 B2 | 4/2014 | Chatterjee et al. |
| 8,706,914 B2 | 4/2014 | Duchesneau |
| 8,713,405 B2 | 4/2014 | Healey et al. |
| 8,725,730 B2 | 5/2014 | Keeton et al. |
| 8,756,387 B2 | 6/2014 | Frost et al. |
| 8,762,793 B2 | 6/2014 | Grube et al. |
| 8,775,858 B2 | 7/2014 | Gower et al. |
| 8,775,868 B2 | 7/2014 | Colgrove et al. |
| 8,788,913 B1 | 7/2014 | Xin et al. |
| 8,799,746 B2 | 8/2014 | Baker et al. |
| 8,819,311 B2 | 8/2014 | Liao |
| 8,819,383 B1 | 8/2014 | Jobanputra et al. |
| 8,824,261 B1 | 9/2014 | Miller et al. |
| 8,843,700 B1 | 9/2014 | Salessi et al. |
| 8,850,108 B1 | 9/2014 | Hayes et al. |
| 8,850,288 B1 | 9/2014 | Lazier et al. |
| 8,856,593 B2 | 10/2014 | Eckhardt et al. |
| 8,856,619 B1 | 10/2014 | Cypher |
| 8,862,847 B2 | 10/2014 | Feng et al. |
| 8,862,928 B2 | 10/2014 | Xavier et al. |
| 8,868,825 B1 | 10/2014 | Hayes |
| 8,874,836 B1 | 10/2014 | Hayes |
| 8,886,778 B2 | 11/2014 | Nedved et al. |
| 8,898,383 B2 | 11/2014 | Yamamoto et al. |
| 8,898,388 B1 | 11/2014 | Kimmel |
| 8,904,231 B2 | 12/2014 | Coatney et al. |
| 8,918,478 B2 | 12/2014 | Ozzie et al. |
| 8,930,307 B2 | 1/2015 | Colgrove et al. |
| 8,930,633 B2 | 1/2015 | Amit et al. |
| 8,949,502 B2 | 2/2015 | McKnight et al. |
| 8,959,110 B2 | 2/2015 | Smith et al. |
| 8,977,597 B2 | 3/2015 | Ganesh et al. |
| 9,003,144 B1 | 4/2015 | Hayes et al. |
| 9,009,724 B2 | 4/2015 | Gold et al. |
| 9,021,053 B2 | 4/2015 | Bembo et al. |
| 9,021,215 B2 | 4/2015 | Meir et al. |
| 9,025,393 B2 | 5/2015 | Wu |
| 9,043,372 B2 | 5/2015 | Makkar et al. |
| 9,053,808 B2 | 6/2015 | Sprouse |
| 9,058,155 B2 | 6/2015 | Cepulis et al. |
| 9,116,819 B2 | 8/2015 | Cope et al. |

(56) References Cited

U.S. PATENT DOCUMENTS

| | | | |
|---|---|---|---|
| 9,117,536 B2 | 8/2015 | Yoon | |
| 9,122,401 B2 | 9/2015 | Zaltsman et al. | |
| 9,134,908 B2 | 9/2015 | Horn et al. | |
| 9,153,337 B2 | 10/2015 | Sutardja | |
| 9,189,650 B2 | 11/2015 | Jaye et al. | |
| 9,201,733 B2 | 12/2015 | Verma | |
| 9,207,876 B2 | 12/2015 | Shu et al. | |
| 9,251,066 B2 | 2/2016 | Colgrove et al. | |
| 9,323,667 B2 | 4/2016 | Bennett | |
| 9,323,681 B2 | 4/2016 | Apostolides et al. | |
| 9,348,538 B2 | 5/2016 | Mallaiah et al. | |
| 9,384,082 B1 | 7/2016 | Lee et al. | |
| 9,390,019 B2 | 7/2016 | Patterson | |
| 9,405,478 B2 | 8/2016 | Koseki et al. | |
| 9,432,541 B2 | 8/2016 | Ishida | |
| 9,477,632 B2 | 10/2016 | Du | |
| 9,552,299 B2 | 1/2017 | Stalzer | |
| 9,818,478 B2 | 11/2017 | Chung | |
| 9,829,066 B2 | 11/2017 | Thomas et al. | |
| 2002/0144059 A1 | 10/2002 | Kendall | |
| 2003/0105984 A1 | 6/2003 | Masuyama et al. | |
| 2003/0110205 A1 | 6/2003 | Johnson | |
| 2004/0161086 A1 | 8/2004 | Buntin et al. | |
| 2005/0001652 A1 | 1/2005 | Malik et al. | |
| 2005/0076228 A1 | 4/2005 | Davis et al. | |
| 2005/0235132 A1 | 10/2005 | Karr et al. | |
| 2005/0278460 A1 | 12/2005 | Shin et al. | |
| 2005/0283649 A1 | 12/2005 | Turner et al. | |
| 2006/0015683 A1 | 1/2006 | Ashmore et al. | |
| 2006/0114930 A1 | 6/2006 | Lucas et al. | |
| 2006/0174157 A1 | 8/2006 | Barrall et al. | |
| 2006/0248294 A1 | 11/2006 | Nedved et al. | |
| 2007/0033205 A1 | 2/2007 | Pradhan | |
| 2007/0079068 A1 | 4/2007 | Draggon | |
| 2007/0214194 A1 | 9/2007 | Reuter | |
| 2007/0214314 A1 | 9/2007 | Reuter | |
| 2007/0234016 A1 | 10/2007 | Davis et al. | |
| 2007/0268905 A1 | 11/2007 | Baker et al. | |
| 2008/0080709 A1 | 4/2008 | Michtchenko et al. | |
| 2008/0095375 A1 | 4/2008 | Takeoka et al. | |
| 2008/0107274 A1 | 5/2008 | Worthy | |
| 2008/0155191 A1 | 6/2008 | Anderson et al. | |
| 2008/0295118 A1 | 11/2008 | Liao | |
| 2009/0077208 A1 | 3/2009 | Nguyen et al. | |
| 2009/0138654 A1 | 5/2009 | Sutardja | |
| 2009/0216910 A1 | 8/2009 | Duchesneau | |
| 2009/0216920 A1 | 8/2009 | Lauterbach et al. | |
| 2010/0017444 A1 | 1/2010 | Chatterjee et al. | |
| 2010/0042636 A1 | 2/2010 | Lu | |
| 2010/0094806 A1 | 4/2010 | Apostolides et al. | |
| 2010/0115070 A1 | 5/2010 | Missimilly | |
| 2010/0125695 A1 | 5/2010 | Wu et al. | |
| 2010/0162076 A1 | 6/2010 | Sim-Tang et al. | |
| 2010/0169707 A1 | 7/2010 | Mathew et al. | |
| 2010/0174576 A1 | 7/2010 | Naylor | |
| 2010/0268908 A1 | 10/2010 | Ouyang et al. | |
| 2010/0312915 A1 | 12/2010 | Marowsky-Bree et al. | |
| 2011/0035540 A1 | 2/2011 | Fitzgerald et al. | |
| 2011/0040925 A1 | 2/2011 | Frost et al. | |
| 2011/0060927 A1 | 3/2011 | Fillingim et al. | |
| 2011/0119462 A1 | 5/2011 | Leach et al. | |
| 2011/0219170 A1 | 9/2011 | Frost et al. | |
| 2011/0238625 A1 | 9/2011 | Hamaguchi et al. | |
| 2011/0264843 A1 | 10/2011 | Haines et al. | |
| 2011/0302369 A1 | 12/2011 | Goto et al. | |
| 2012/0011398 A1 | 1/2012 | Eckhardt | |
| 2012/0079318 A1 | 3/2012 | Colgrove et al. | |
| 2012/0110249 A1 | 5/2012 | Jeong et al. | |
| 2012/0131253 A1* | 5/2012 | McKnight | G06F 1/30 710/308 |
| 2012/0150826 A1 | 6/2012 | Retnamma et al. | |
| 2012/0158923 A1 | 6/2012 | Mohamed et al. | |
| 2012/0191900 A1 | 7/2012 | Kunimatsu et al. | |
| 2012/0198152 A1 | 8/2012 | Terry et al. | |
| 2012/0198261 A1 | 8/2012 | Brown et al. | |
| 2012/0209943 A1 | 8/2012 | Jung | |
| 2012/0226934 A1 | 9/2012 | Rao | |
| 2012/0246435 A1 | 9/2012 | Meir et al. | |
| 2012/0260055 A1 | 10/2012 | Murase | |
| 2012/0311557 A1 | 12/2012 | Resch | |
| 2013/0022201 A1 | 1/2013 | Glew et al. | |
| 2013/0036314 A1 | 2/2013 | Glew et al. | |
| 2013/0042056 A1 | 2/2013 | Shats | |
| 2013/0060884 A1 | 3/2013 | Bembo et al. | |
| 2013/0067188 A1 | 3/2013 | Mehra et al. | |
| 2013/0073894 A1 | 3/2013 | Xavier et al. | |
| 2013/0124776 A1 | 5/2013 | Hallak et al. | |
| 2013/0132800 A1 | 5/2013 | Healy et al. | |
| 2013/0151653 A1 | 6/2013 | Sawicki et al. | |
| 2013/0151771 A1 | 6/2013 | Tsukahara et al. | |
| 2013/0173853 A1 | 7/2013 | Ungureanu et al. | |
| 2013/0238554 A1 | 9/2013 | Yucel et al. | |
| 2013/0259234 A1 | 10/2013 | Acar et al. | |
| 2013/0262758 A1 | 10/2013 | Smith et al. | |
| 2013/0339314 A1 | 12/2013 | Carpenter et al. | |
| 2013/0339635 A1 | 12/2013 | Amit et al. | |
| 2013/0339818 A1 | 12/2013 | Baker et al. | |
| 2014/0032815 A1* | 1/2014 | Mangalindan | G06F 13/4243 711/103 |
| 2014/0040535 A1 | 2/2014 | Lee | |
| 2014/0040702 A1 | 2/2014 | He et al. | |
| 2014/0047263 A1 | 2/2014 | Coatney et al. | |
| 2014/0047269 A1 | 2/2014 | Kim | |
| 2014/0063721 A1 | 3/2014 | Herman et al. | |
| 2014/0064048 A1 | 3/2014 | Cohen et al. | |
| 2014/0068224 A1 | 3/2014 | Fan et al. | |
| 2014/0075252 A1 | 3/2014 | Luo et al. | |
| 2014/0136880 A1 | 5/2014 | Shankar et al. | |
| 2014/0181402 A1 | 6/2014 | White | |
| 2014/0237164 A1 | 8/2014 | Le et al. | |
| 2014/0279936 A1 | 9/2014 | Bembo et al. | |
| 2014/0280025 A1 | 9/2014 | Eidson et al. | |
| 2014/0289588 A1 | 9/2014 | Nagadomi et al. | |
| 2014/0380125 A1 | 12/2014 | Calder et al. | |
| 2014/0380126 A1 | 12/2014 | Yekhanin et al. | |
| 2015/0032720 A1 | 1/2015 | James | |
| 2015/0039645 A1 | 2/2015 | Lewis | |
| 2015/0039849 A1 | 2/2015 | Lewis | |
| 2015/0089283 A1 | 3/2015 | Kermarrec et al. | |
| 2015/0089623 A1 | 3/2015 | Sondhi et al. | |
| 2015/0100746 A1 | 4/2015 | Rychlik | |
| 2015/0134824 A1 | 5/2015 | Mickens et al. | |
| 2015/0153800 A1 | 6/2015 | Lucal et al. | |
| 2015/0180714 A1 | 6/2015 | Chunn | |
| 2015/0280959 A1 | 10/2015 | Vincent | |
| 2016/0147582 A1* | 5/2016 | Karakulak | G11C 16/3418 714/37 |

FOREIGN PATENT DOCUMENTS

| | | |
|---|---|---|
| EP | 2639997 | 9/2013 |
| WO | 02-130033 | 2/2002 |
| WO | 2006069235 | 6/2006 |
| WO | 2008103569 | 8/2008 |
| WO | 2008157081 | 12/2008 |
| WO | 2012174427 | 12/2012 |
| WO | 2013032544 | 3/2013 |
| WO | 2013032825 | 7/2013 |

OTHER PUBLICATIONS

Schmid, Patrick: "RAID Scaling Charts, Part 3:4-128 kB Stripes Compared", Tom's Hardware, Nov. 27, 2007 (http://www.tomshardware.com/reviews/RAID-SCALING-CHARTS.1735-4.html), See pp. 1-2.

Stalzer, Mark A., "FlashBlades: System Architecture and Applications," Proceedings of the 2nd Workshop on Architectures and Systems for Big Data, Association for Computing Machinery, New York, NY, 2012, pp. 10-14.

Ju-Kyeong Kim et al., "Data Access Frequency based Data Replication Method using Erasure Codes in Cloud Storage System", Journal of the Institute of Electronics and Information Engineers, Feb. 2014, vol. 51, No. 2, pp. 85-91.

(56) References Cited

OTHER PUBLICATIONS

Hwang, Kai, et al. "RAID-x: A New Distributed Disk Array for I/O-Centric Cluster Computing," HPDC '00 Proceedings of the 9th IEEE International Symposium on High Performance Distributed Computing, IEEE, 2000, pp. 279-286.
Storer, Mark W., et al., "Pergamum: Replacing Tape with Energy Efficient, Reliable, Disk-Based Archival Storage," Fast '08: 6th USENIX Conference on File and Storage Technologies, San Jose, CA, Feb. 26-29, 2008 pp. 1-16.
International Search Report and the Written Opinion of the International Searching Authority, PCT/US2015/018169, dated May 15, 2015.
International Search Report and the Written Opinion of the International Searching Authority, PCT/US2015/034302, dated Sep. 11, 2015.
International Search Report and the Written Opinion of the International Searching Authority, PCT/US2015/039135, dated Sep. 18, 2015.
International Search Report and the Written Opinion of the International Searching Authority, PCT/US2015/039136, dated Sep. 23, 2015.
International Search Report, PCT/US2015/039142, dated Sep. 24, 2015.
International Search Report, PCT/US2015/034291, dated Sep. 30, 2015.
International Search Report and the Written Opinion of the International Searching Authority, PCT/US2015/039137, dated Oct. 1, 2015.
International Search Report, PCT/US2015/044370, dated Dec. 15, 2015.
International Search Report and the Written Opinion of the International Searching Authority, PCT/US2016/031039, dated May 5, 2016.
International Search Report, PCT/US2015/014604, dated May 19, 2016.
International Search Report, PCT/US2015/014361, dated May 30, 2016.
International Search Report, PCT/US2016/014356, dated Jun. 28, 2016.
International Search Report, PCT/US2016/014357, dated Jun. 29, 2016.
International Search Report and the Written Opinion of the International Searching Authority, PCT/US2016/016504, dated Jul. 6, 2016.
International Search Report and the Written Opinion of the International Searching Authority, PCT/US2016/024391, dated Jul. 12, 2016.
International Search Report and the Written Opinion of the International Searching Authority, PCT/US2016/026529, dated Jul. 19, 2016.
International Search Report and the Written Opinion of the International Searching Authority, PCT/US2016/023485, dated Jul. 21, 2016.
International Search Report and the Written Opinion of the International Searching Authority, PCT/US2016/033306, dated Aug. 19, 2016.
International Search Report and the Written Opinion of the International Searching Authority, PCT/US2016/047808, dated Nov. 25, 2016.
International Search Report and the Written Opinion of the International Searching Authority, PCT/US2016/042147, dated Nov. 30, 2016.
International Search Report and the Written Opinion of the International Searching Authority, PCT/US2016/054080, dated Dec. 21, 2016.
International Search Report and the Written Opinion of the International Searching Authority, PCT/US2016/056917, dated Jan. 27, 2017.

\* cited by examiner

CALIBRATION OF FLASH CHANNELS IN SSD

BACKGROUND

NAND flash memory is available from different vendors, with different flash memory device interfaces and protocols. These protocols include asynchronous SDR (single data rate), synchronous DDR (double data rate), Toggle inode (also a type of DDR or double data rate, in various release versions and from various manufacturers) and ONFI (Open NAND Flash Interface Working Group Standard, also a type of DDR or double data rate, in various release versions and from various manufacturers), and others may be developed. The proliferation of flash memory device interfaces and protocols poses a problem to designers of flash controllers for various storage devices, who generally choose one flash memory device interface and one protocol, and design the flash controller according to those. It then becomes difficult to change suppliers, or cope with shortages in the marketplace or advances in flash memory product capabilities during a flash controller product lifetime. Also, flash memory device characteristics may change over the lifespan of a flash die, which can degrade the performance of a storage system that uses a particular flash controller and flash memory die(s). In addition, upgrades to the system or software upgrades tend to be disruptive and the calibration of a system may be lost during a power interruption to the system. It is within this context that the embodiments arise.

SUMMARY

In some embodiments, a method for communicating with memory, performed by a memory controller, is provided. The method includes sampling reads from a plurality of memory devices and storing first calibration points in first buffers, based on the sampling, with at least one first calibration point and corresponding first buffer for each of the plurality of memory devices. The method includes sampling a read from a second memory device in background while performing a read from a first memory device using the first calibration point in the first buffer corresponding to the first memory device. The method includes storing a second calibration point in a second buffer, for the second memory device, based on the sampling in the background, with the first buffer for the second memory device having the first calibration point used for ongoing reads of the second memory device. A memory controller that performs the method is also provided.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
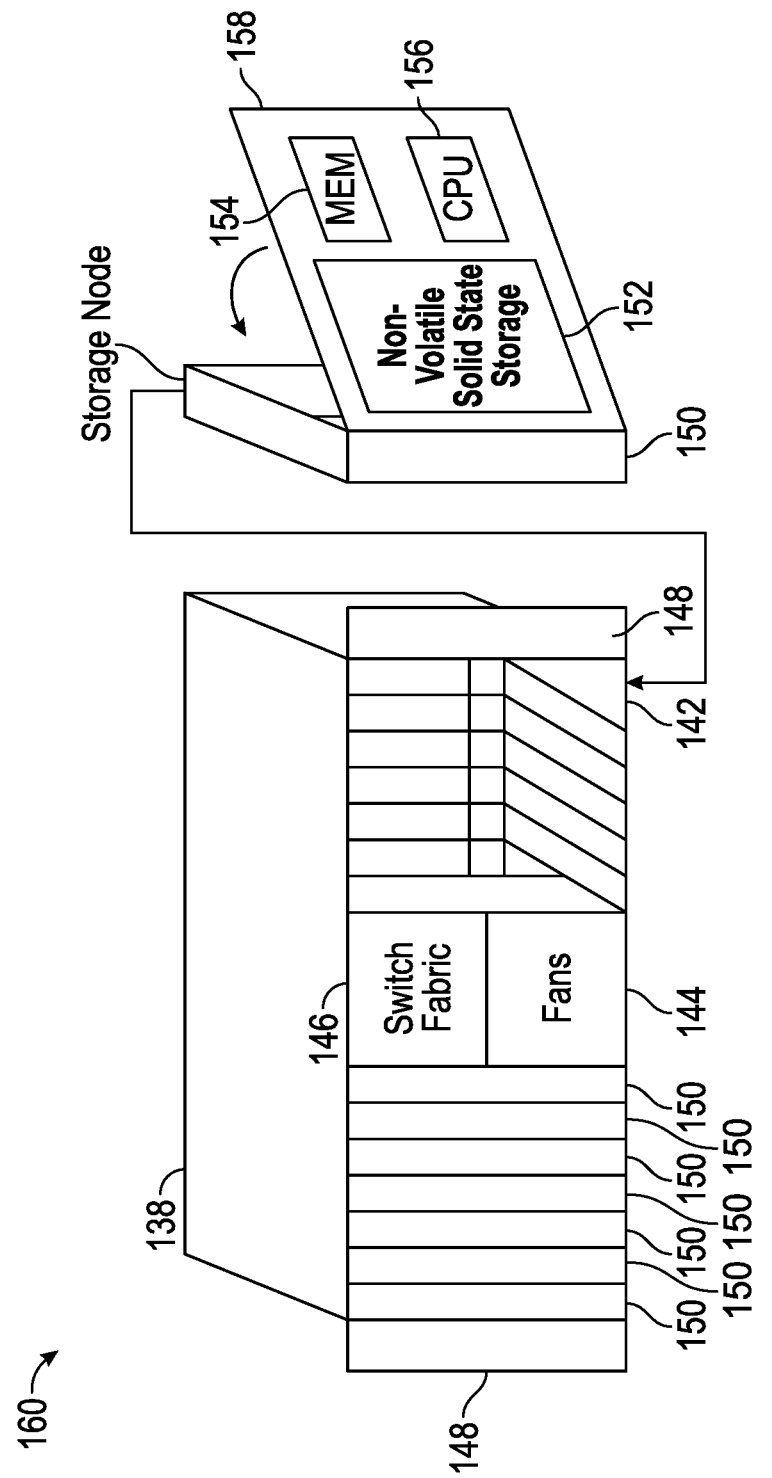
FIG. 1 is a perspective view of a storage cluster with multiple storage nodes and internal storage coupled to each storage node to provide network attached storage, in accordance with some embodiments.

Various storage systems described herein, and further storage systems, can be optimized for distribution of selected data, according to various criteria, in flash or other solid-state memory. The embodiments for the distributed flash wear leveling system are optimized for faster read access to the flash or other solid-state memory. Flash memory that is worn, i.e., that has a large number of program/erase cycles, often or usually has a greater error rate during read accesses, and this adds to read latency for data bits as a result of the processing time overhead to perform error correction. Various embodiments of the storage system track program/erase cycles, or track read errors or error rates, for example on a page, block, die, package, board, storage unit or storage node basis, are aware of faster and slower types or designs of flash memory or portions of flash memory, or otherwise determine relative access speeds for flash memory. The storage system then places data selectively in faster access or slower access locations in or portions of flash memory (or other solid-state memory). One embodiments of the storage system writes data bits to faster access portions of flash memory and parity bits to slower access portions of flash memory. Another embodiment takes advantage of faster and slower access pages of triple level cell flash memory. Principles of operation, variations, and implementation details for distributed flash wear leveling are further discussed below, with reference to FIGS. 6-12, following description of embodiments of a storage cluster with storage nodes, suitable for distributed flash wear leveling, with reference to FIGS. 1-5. Calibration of flash channels is described with reference to FIGS. 13-15.

The embodiments below describe a storage cluster that stores user data, such as user data originating from one or more user or client systems or other sources external to the storage cluster. The storage cluster distributes user data across storage nodes housed within a chassis, using erasure coding and redundant copies of metadata. Erasure coding refers to a method of data protection or reconstruction in which data is stored across a set of different locations, such as disks, storage nodes or geographic locations. Flash memory is one type of solid-state memory that may be integrated with the embodiments, although the embodiments may be extended to other types of solid-state memory or other storage medium, including non-solid state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server.

The storage cluster is contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of both the power distribution and the communication bus which may be enabled or disabled independently. The internal communication bus may be an Ethernet bus, however, other technologies such as Peripheral Component Interconnect (PCI) Express, InfiniBand, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system (NFS), common internet file system (CIFS), small computer system interface (SCSI) or hypertext transfer protocol (HTTP). Translation from the client protocol may occur at the switch, chassis external communication bus or within each storage node.

Each storage node may be one or more storage servers and each storage server is connected to one or more non-volatile solid state memory units, which may be referred to as storage units or storage devices. One embodiment includes a single storage server in each storage node and between one to eight non-volatile solid state memory units, however this one example is not meant to be limiting. The storage server may include a processor, dynamic random access memory (DRAM) and interfaces for the internal communication bus and power distribution for each of the power buses. Inside the storage node, the interfaces and storage unit share a communication bus, e.g., PCI Express, in some embodiments. The non-volatile solid state memory units may directly access the internal communication bus interface through a storage node communication bus, or request the storage node to access the bus interface. The non-volatile solid state memory unit contains an embedded central processing unit (CPU), solid state storage controller, and a quantity of solid state mass storage, e.g., between 2-32 terabytes (TB) in some embodiments. An embedded volatile storage medium, such as DRAM, and an energy reserve apparatus are included in the non-volatile solid state memory unit. In some embodiments, the energy reserve apparatus is a capacitor, super-capacitor, or battery that enables transferring a subset of DRAM contents to a stable storage medium in the case of power loss. In some embodiments, the non-volatile solid state memory unit is constructed with a storage class memory, such as phase change or magnetoresistive random access memory (MRAM) that substitutes for DRAM and enables a reduced power hold-up apparatus.

One of many features of the storage nodes and non-volatile solid state storage is the ability to proactively rebuild data in a storage cluster. The storage nodes and non-volatile solid state storage can determine when a storage node or non-volatile solid state storage in the storage cluster is unreachable, independent of whether there is an attempt to read data involving that storage node or non-volatile solid state storage. The storage nodes and non-volatile solid state storage then cooperate to recover and rebuild the data in at least partially new locations. This constitutes a proactive rebuild, in that the system rebuilds data without waiting until the data is needed for a read access initiated from a client system employing the storage cluster. These and further details of the storage memory and operation thereof are discussed below.

FIG. 1 is a perspective view of a storage cluster 160, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 160, each having one or more storage nodes 150, in a flexible and reconfigurable arrangement of both the physical components and the amount of storage memory provided thereby. The storage cluster 160 is designed to fit in a rack, and one or more racks can be set up and populated as desired for the storage memory. The storage cluster 160 has a chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in FIG. 1, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 158 populated by a CPU 156, i.e., processor, a memory 154 coupled to the CPU 156, and a non-volatile solid state storage 152 coupled to the CPU 156, although other mountings and/or components could be used in further embodiments. The memory 154 has instructions which are executed by the CPU 156 and/or data operated on by the CPU 156. As further explained below, the non-volatile solid state storage 152 includes flash or, in further embodiments, other types of solid-state memory.

Referring to FIG. 1, storage cluster 160 is scalable, meaning that storage capacity with non-uniform storage sizes is readily added, as described above. One or more storage nodes 150 can be plugged into or removed from each chassis and the storage cluster self-configures in some embodiments. Plug-in storage nodes 150, whether installed in a chassis as delivered or later added, can have different sizes. For example, in one embodiment a storage node 150 can have any multiple of 4 TB, e.g., 8 TB, 12 TB, 16 TB, 32 TB, etc. In further embodiments, a storage node 150 could have any multiple of other storage amounts or capacities. Storage capacity of each storage node 150 is broadcast, and influences decisions of how to stripe the data. For maximum storage efficiency, an embodiment can self-configure as wide as possible in the stripe, subject to a predetermined requirement of continued operation with loss of up to one, or up to two, non-volatile solid state storage units 152 or storage nodes 150 within the chassis.

Figure 2:
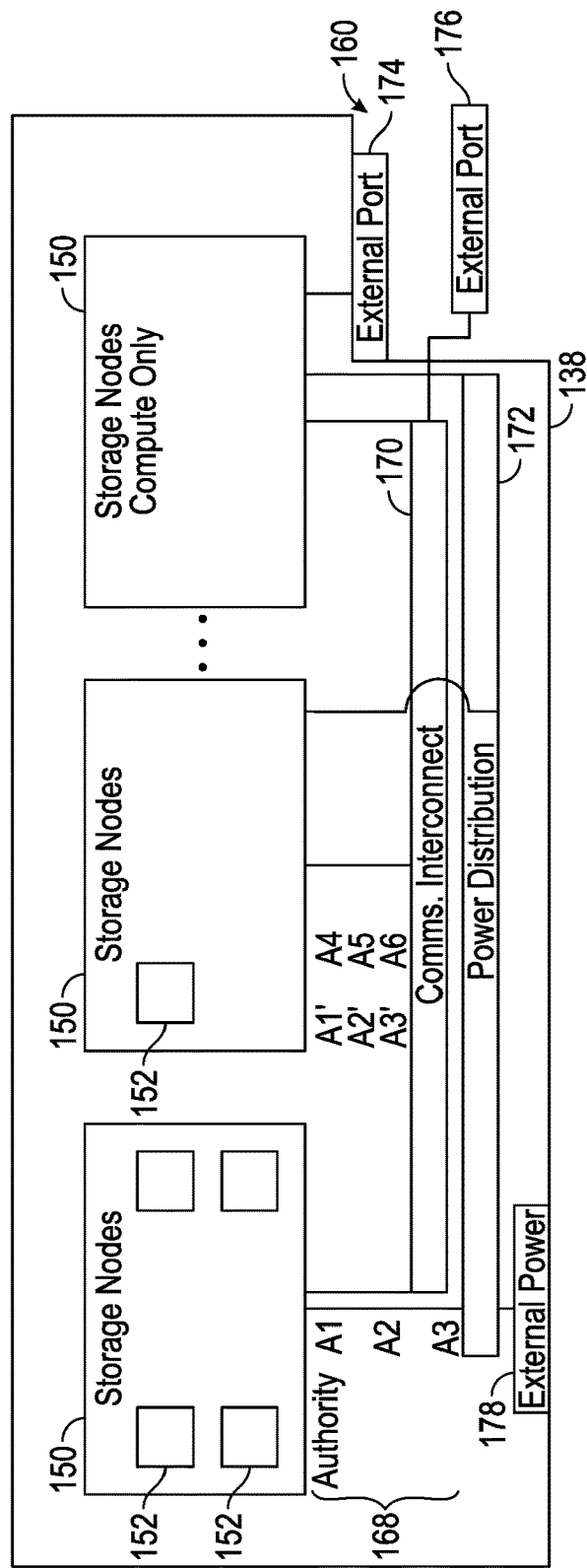
FIG. 2 is a block diagram showing an interconnect switch coupling multiple storage nodes in accordance with some embodiments.

FIG. 2 is a block diagram showing a communications interconnect 170 and power distribution bus 172 coupling multiple storage nodes 150. Referring back to FIG. 1, the communications interconnect 170 can be included in or implemented with the switch fabric 146 in some embodiments. Where multiple storage clusters 160 occupy a rack, the communications interconnect 170 can be included in or implemented with a top of rack switch, in some embodiments. As illustrated in FIG. 2, storage cluster 160 is enclosed within a single chassis 138. External port 176 is coupled to storage nodes 150 through communications interconnect 170, while external port 174 is coupled directly to a storage node. External power port 178 is coupled to power distribution bus 172. Storage nodes 150 may include varying amounts and differing capacities of non-volatile solid state storage 152 as described with reference to FIG. 1. In addition, one or more storage nodes 150 may be a compute only storage node as illustrated in FIG. 2. Authorities 168 are implemented on the non-volatile solid state storages 152, for example as lists or other data structures stored in memory. In some embodiments the authorities are stored within the non-volatile solid state storage 152 and supported by software executing on a controller or other processor of the non-volatile solid state storage 152. In a further embodiment, authorities 168 are implemented on the storage nodes 150, for example as lists or other data structures stored in the memory 154 and supported by software executing on the CPU 156 of the storage node 150. Authorities 168 control how and where data is stored in the non-volatile solid state storages 152 in some embodiments. This control assists in determining which type of erasure coding scheme is applied to the data, and which storage nodes 150 have which portions of the data. Each authority 168 may be assigned to a non-volatile solid state storage 152. Each authority may control a range of inode numbers, segment numbers, or other data identifiers which are assigned to data by a file system, by the storage nodes 150, or by the non-volatile solid state storage 152, in various embodiments.

Every piece of data, and every piece of metadata, has redundancy in the system in some embodiments. In addition, every piece of data and every piece of metadata has an owner, which may be referred to as an authority. If that authority is unreachable, for example through failure of a storage node, there is a plan of succession for how to find that data or that metadata. In various embodiments, there are redundant copies of authorities 168. Authorities 168 have a relationship to storage nodes 150 and non-volatile solid state storage 152 in some embodiments. Each authority 168, covering a range of data segment numbers or other identifiers of the data, may be assigned to a specific non-volatile solid state storage 152. In some embodiments the authorities 168 for all of such ranges are distributed over the non-volatile solid state storages 152 of a storage cluster. Each storage node 150 has a network port that provides access to the non-volatile solid state storage(s) 152 of that storage node 150. Data can be stored in a segment, which is associated with a segment number and that segment number is an indirection for a configuration of a RAID (redundant array of independent disks) stripe in some embodiments. The assignment and use of the authorities 168 thus establishes an indirection to data. Indirection may be referred to as the ability to reference data indirectly, in this case via an authority 168, in accordance with some embodiments. A segment identifies a set of non-volatile solid state storage 152 and a local identifier into the set of non-volatile solid state storage 152 that may contain data. In some embodiments, the local identifier is an offset into the device and may be reused sequentially by multiple segments. In other embodiments the local identifier is unique for a specific segment and never reused. The offsets in the non-volatile solid state storage 152 are applied to locating data for writing to or reading from the non-volatile solid state storage 152 (in the form of a RAID stripe). Data is striped across multiple units of non-volatile solid state storage 152, which may include or be different from the non-volatile solid state storage 152 having the authority 168 for a particular data segment.

If there is a change in where a particular segment of data is located, e.g., during a data move or a data reconstruction, the authority 168 for that data segment should be consulted, at that non-volatile solid state storage 152 or storage node 150 having that authority 168. In order to locate a particular piece of data, embodiments calculate a hash value for a data segment or apply an inode number or a data segment number. The output of this operation points to a non-volatile solid state storage 152 having the authority 168 for that particular piece of data. In some embodiments there are two stages to this operation. The first stage maps an entity identifier (ID), e.g., a segment number, inode number, or directory number to an authority identifier. This mapping may include a calculation such as a hash or a bit mask. The second stage is mapping the authority identifier to a particular non-volatile solid state storage 152, which may be done through an explicit mapping. The operation is repeatable, so that when the calculation is performed, the result of the calculation repeatably and reliably points to a particular non-volatile solid state storage 152 having that authority 168. The operation may include the set of reachable storage nodes as input. If the set of reachable non-volatile solid state storage units changes the optimal set changes. In some embodiments, the persisted value is the current assignment (which is always true) and the calculated value is the target assignment the cluster will attempt to reconfigure towards. This calculation may be used to determine the optimal non-volatile solid state storage 152 for an authority in the presence of a set of non-volatile solid state storage 152 that are reachable and constitute the same cluster. The calculation also determines an ordered set of peer non-volatile solid state storage 152 that will also record the authority to non-volatile solid state storage mapping so that the authority may be determined even if the assigned non-volatile solid state storage is unreachable. A duplicate or substitute authority 168 may be consulted if a specific authority 168 is unavailable in some embodiments.

With reference to FIGS. 1 and 2, two of the many tasks of the CPU 156 on a storage node 150 are to break up write data, and reassemble read data. When the system has determined that data is to be written, the authority 168 for that data is located as above. When the segment ID for data is already determined the request to write is forwarded to the non-volatile solid state storage 152 currently determined to be the host of the authority 168 determined from the segment. The host CPU 156 of the storage node 150, on which the non-volatile solid state storage 152 and corresponding authority 168 reside, then breaks up or shards the data and transmits the data out to various non-volatile solid state storage 152. The transmitted data is written as a data stripe in accordance with an erasure coding scheme. In some embodiments, data is requested to be pulled, and in other embodiments, data is pushed. In reverse, when data is read, the authority 168 for the segment ID containing the data is located as described above. The host CPU 156 of the storage node 150 on which the non-volatile solid state storage 152 and corresponding authority 168 reside requests the data from the non-volatile solid state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid state storage 152. In some embodiments, the segment host requests the data be sent to storage node 150 by requesting pages from storage and then sending the data to the storage node making the original request.

In some systems, for example in UNIX-style file systems, data is handled with an index node or inode, which specifies a data structure that represents an object in a file system. The object could be a file or a directory, for example. Metadata may accompany the object, as attributes such as permission data and a creation timestamp, among other attributes. A segment number could be assigned to all or a portion of such an object in a file system. In other systems, data segments are handled with a segment number assigned elsewhere. For purposes of discussion, the unit of distribution is an entity, and an entity can be a file, a directory or a segment. That is, entities are units of data or metadata stored by a storage system. Entities are grouped into sets called authorities. Each authority has an authority owner, which is a storage node that has the exclusive right to update the entities in the authority. In other words, a storage node contains the authority, and that the authority, in turn, contains entities.

A segment is a logical container of data in accordance with some embodiments. A segment is an address space between medium address space and physical flash locations, i.e., the data segment number, are in this address space. Segments may also contain metadata, which enable data redundancy to be restored (rewritten to different flash locations or devices) without the involvement of higher level software. In one embodiment, an internal format of a segment contains client data and medium mappings to determine the position of that data. Each data segment is protected, e.g., from memory and other failures, by breaking the segment into a number of data and parity shards, where applicable. The data and parity shards are distributed, i.e., striped, across non-volatile solid state storage 152 coupled to the host CPUs 156 (See FIG. 5) in accordance with an erasure coding scheme. Usage of the term segments refers to the container and its place in the address space of segments in some embodiments. Usage of the term stripe refers to the same set of shards as a segment and includes how the shards are distributed along with redundancy or parity information in accordance with some embodiments.

A series of address-space transformations takes place across an entire storage system. At the top are the directory entries (file names) which link to an inode. Inodes point into medium address space, where data is logically stored. Medium addresses may be mapped through a series of indirect mediums to spread the load of large files, or implement data services like deduplication or snapshots. Medium addresses may be mapped through a series of indirect mediums to spread the load of large files, or implement data services like deduplication or snapshots. Segment addresses are then translated into physical flash locations. Physical flash locations have an address range bounded by the amount of flash in the system in accordance with some embodiments. Medium addresses and segment addresses are logical containers, and in some embodiments use a 128 bit or larger identifier so as to be practically infinite, with a likelihood of reuse calculated as longer than the expected life of the system. Addresses from logical containers are allocated in a hierarchical fashion in some embodiments. Initially, each non-volatile solid state storage unit 152 may be assigned a range of address space. Within this assigned range, the non-volatile solid state storage 152 is able to allocate addresses without synchronization with other non-volatile solid state storage 152.

Data and metadata is stored by a set of underlying storage layouts that are optimized for varying workload patterns and storage devices. These layouts incorporate multiple redundancy schemes, compression formats and index algorithms. Some of these layouts store information about authorities and authority masters, while others store file metadata and file data. The redundancy schemes include error correction codes that tolerate corrupted bits within a single storage device (such as a NAND flash chip), erasure codes that tolerate the failure of multiple storage nodes, and replication schemes that tolerate data center or regional failures. In some embodiments, low density parity check (LDPC) code is used within a single storage unit. Reed-Solomon encoding is used within a storage cluster, and mirroring is used within a storage grid in some embodiments. Metadata may be stored using an ordered log structured index (such as a Log Structured Merge Tree), and large data may not be stored in a log structured layout.

In order to maintain consistency across multiple copies of an entity, the storage nodes agree implicitly on two things through calculations: (1) the authority that contains the entity, and (2) the storage node that contains the authority. The assignment of entities to authorities can be done by pseudo randomly assigning entities to authorities, by splitting entities into ranges based upon an externally produced key, or by placing a single entity into each authority. Examples of pseudorandom schemes are linear hashing and the Replication Under Scalable Hashing (RUSH) family of hashes, including Controlled Replication Under Scalable Hashing (CRUSH). In some embodiments, pseudo-random assignment is utilized only for assigning authorities to nodes because the set of nodes can change. The set of authorities cannot change so any subjective function may be applied in these embodiments. Some placement schemes automatically place authorities on storage nodes, while other placement schemes rely on an explicit mapping of authorities to storage nodes. In some embodiments, a pseudorandom scheme is utilized to map from each authority to a set of candidate authority owners. A pseudorandom data distribution function related to CRUSH may assign authorities to storage nodes and create a list of where the authorities are assigned. Each storage node has a copy of the pseudorandom data distribution function, and can arrive at the same calculation for distributing, and later finding or locating an authority. Each of the pseudorandom schemes requires the reachable set of storage nodes as input in some embodiments in order to conclude the same target nodes. Once an entity has been placed in an authority, the entity may be stored on physical devices so that no expected failure will lead to unexpected data loss. In some embodiments, rebalancing algorithms attempt to store the copies of all entities within an authority in the same layout and on the same set of machines.

Examples of expected failures include device failures, stolen machines, datacenter fires, and regional disasters, such as nuclear or geological events. Different failures lead to different levels of acceptable data loss. In some embodiments, a stolen storage node impacts neither the security nor the reliability of the system, while depending on system configuration, a regional event could lead to no loss of data, a few seconds or minutes of lost updates, or even complete data loss.

In the embodiments, the placement of data for storage redundancy is independent of the placement of authorities for data consistency. In some embodiments, storage nodes that contain authorities do not contain any persistent storage. Instead, the storage nodes are connected to non-volatile solid state storage units that do not contain authorities. The communications interconnect between storage nodes and non-volatile solid state storage units consists of multiple communication technologies and has non-uniform performance and fault tolerance characteristics. In some embodiments, as mentioned above, non-volatile solid state storage units are connected to storage nodes via PCI express, storage nodes are connected together within a single chassis using Ethernet backplane, and chassis are connected together to form a storage cluster. Storage clusters are connected to clients using Ethernet or fiber channel in some embodiments. If multiple storage clusters are configured into a storage grid, the multiple storage clusters are connected using the Internet or other long-distance networking links, such as a "metro scale" link or private link that does not traverse the internet.

Authority owners have the exclusive right to modify entities, to migrate entities from one non-volatile solid state storage unit to another non-volatile solid state storage unit, and to add and remove copies of entities. This allows for maintaining the redundancy of the underlying data. When an authority owner fails, is going to be decommissioned, or is overloaded, the authority is transferred to a new storage node. Transient failures make it non-trivial to ensure that all non-faulty machines agree upon the new authority location. The ambiguity that arises due to transient failures can be achieved automatically by a consensus protocol such as Paxos, hot-warm failover schemes, via manual intervention by a remote system administrator, or by a local hardware administrator (such as by physically removing the failed machine from the cluster, or pressing a button on the failed machine). In some embodiments, a consensus protocol is used, and failover is automatic. If too many failures or replication events occur in too short a time period, the system goes into a self-preservation mode and halts replication and data movement activities until an administrator intervenes in accordance with some embodiments.

As authorities are transferred between storage nodes and authority owners update entities in their authorities, the system transfers messages between the storage nodes and non-volatile solid state storage units. With regard to persistent messages, messages that have different purposes are of different types. Depending on the type of the message, the system maintains different ordering and durability guarantees. As the persistent messages are being processed, the messages are temporarily stored in multiple durable and non-durable storage hardware technologies. In some embodiments, messages are stored in RAM, NVRAM and on NAND flash devices, and a variety of protocols are used in order to make efficient use of each storage medium. Latency-sensitive client requests may be persisted in replicated NVRAM, and then later NAND, while background rebalancing operations are persisted directly to NAND.

Persistent messages are persistently stored prior to being transmitted. This allows the system to continue to serve client requests despite failures and component replacement. Although many hardware components contain unique identifiers that are visible to system administrators, manufacturer, hardware supply chain and ongoing monitoring quality control infrastructure, applications running on top of the infrastructure address virtualize addresses. These virtualized addresses do not change over the lifetime of the storage system, regardless of component failures and replacements. This allows each component of the storage system to be replaced over time without reconfiguration or disruptions of client request processing.

In some embodiments, the virtualized addresses are stored with sufficient redundancy. A continuous monitoring system correlates hardware and software status and the hardware identifiers. This allows detection and prediction of failures due to faulty components and manufacturing details. The monitoring system also enables the proactive transfer of authorities and entities away from impacted devices before failure occurs by removing the component from the critical path in some embodiments.

Figure 3:
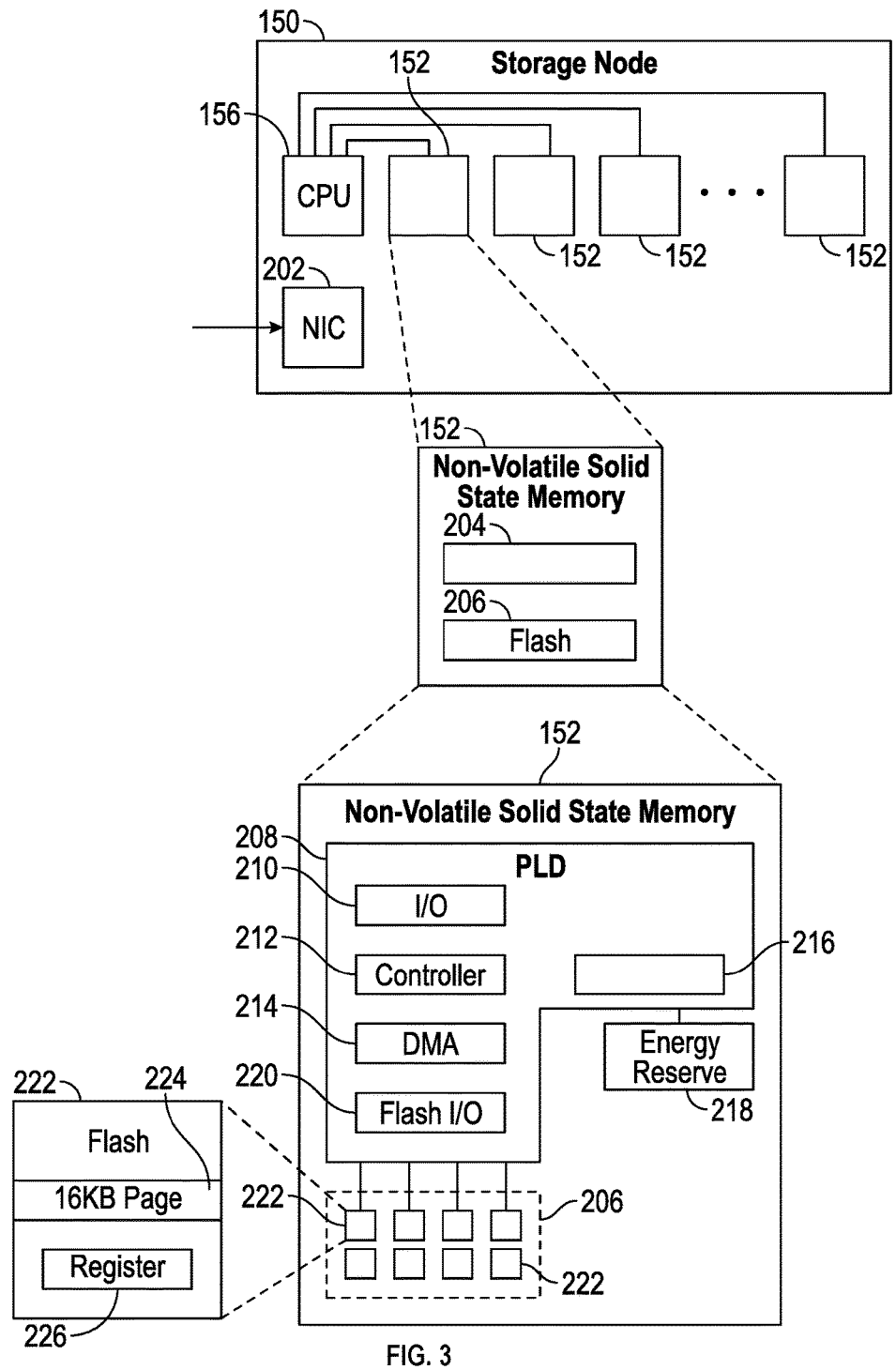
FIG. 3 is a multiple level block diagram, showing contents of a storage node and contents of one of the non-volatile solid state storage units in accordance with some embodiments.

FIG. 3 is a multiple level block diagram, showing contents of a storage node 150 and contents of a non-volatile solid state storage 152 of the storage node 150. Data is communicated to and from the storage node 150 by a network interface controller (NIC) 202 in some embodiments. Each storage node 150 has a CPU 156, and one or more non-volatile solid state storage 152, as discussed above. Moving down one level in FIG. 3, each non-volatile solid state storage 152 has a relatively fast non-volatile solid state memory, such as nonvolatile random access memory (NVRAM) 204, and flash memory 206. In some embodiments, NVRAM 204 may be a component that does not require program/erase cycles (DRAM, MRAM, PCM), and can be a memory that can support being written vastly more often than the memory is read from. Moving down another level in FIG. 3, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e. multichip packages), in hybrid packages, as bare dies on a printed circuit board or other substrate, as encapsulated dies, etc. In the embodiment shown, the non-volatile solid state storage 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device (PLD) 208, e.g., a field programmable gate array (FPGA). In this embodiment, each flash die 222 has pages, organized as sixteen kB (kilobyte) pages 224, and a register 226 through which data can be written to or read from the flash die 222. In further embodiments, other types of solid-state memory are used in place of, or in addition to flash memory illustrated within flash die 222.

Storage clusters 160, in various embodiments as disclosed herein, can be contrasted with storage arrays in general. The storage nodes 150 are part of a collection that creates the storage cluster 160. Each storage node 150 owns a slice of data and computing required to provide the data. Multiple storage nodes 150 cooperate to store and retrieve the data. Storage memory or storage devices, as used in storage arrays in general, are less involved with processing and manipulating the data. Storage memory or storage devices in a storage array receive commands to read, write, or erase data. The storage memory or storage devices in a storage array are not aware of a larger system in which they are embedded, or what the data means. Storage memory or storage devices in storage arrays can include various types of storage memory, such as RAM, solid state drives, hard disk drives, etc. The storage units 152 described herein have multiple interfaces active simultaneously and serving multiple purposes. In some embodiments, some of the functionality of a storage node 150 is shifted into a storage unit 152, transforming the storage unit 152 into a combination of storage unit 152 and storage node 150. Placing computing (relative to storage data) into the storage unit 152 places this computing closer to the data itself. The various system embodiments have a hierarchy of storage node layers with different capabilities. By contrast, in a storage array, a controller owns and knows everything about all of the data that the controller manages in a shelf or storage devices. In a storage cluster 160, as described herein, multiple controllers in multiple storage units 152 and/or storage nodes 150 cooperate in various ways (e.g., for erasure coding, data sharding, metadata communication and redundancy, storage capacity expansion or contraction, data recovery, and so on).

Figure 4:
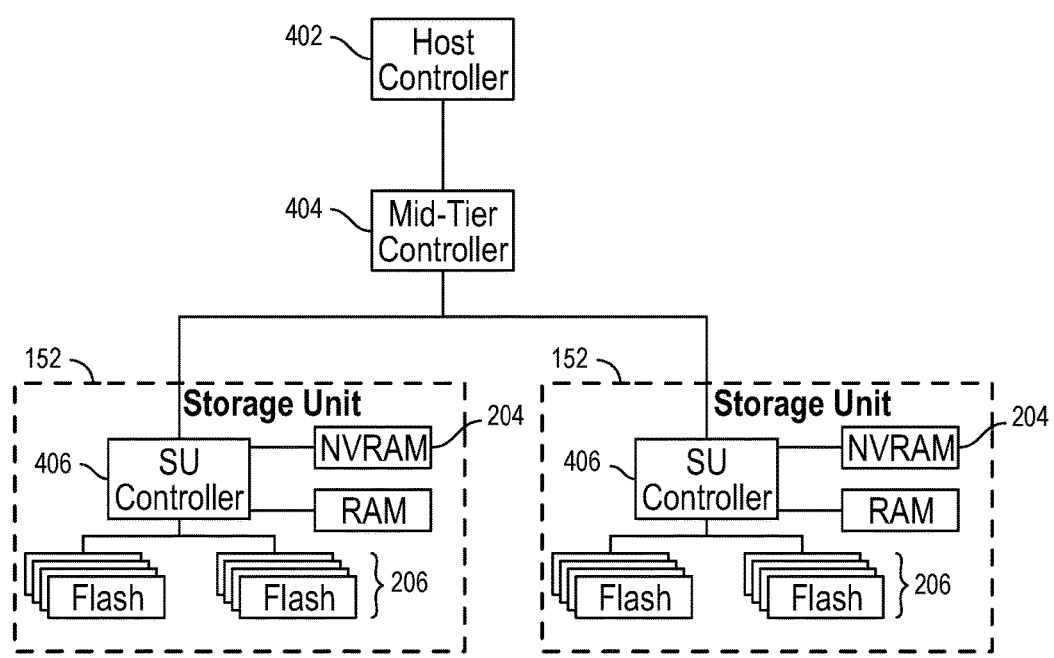
FIG. 4 shows a storage server environment, which may utilize the embodiments of the storage nodes and storage units of FIGS. 1-3.

FIG. 4 shows a storage server environment, which uses embodiments of the storage nodes 150 and storage units 152 of FIGS. 1-3. In this version, each storage unit 152 has a processor such as controller 212 (see FIG. 3), an FPGA (field programmable gate array), flash memory 206, and NVRAM 204 (which may be super-capacitor backed DRAM 216, see FIG. 3) on a PCIe (peripheral component interconnect express) board in a chassis 138 (see FIG. 1). The storage unit 152 may be implemented as a single board containing storage, and may be the largest tolerable failure domain inside the chassis. In some embodiments, up to two storage units 152 may fail and the device will continue with no data loss.

The physical storage is divided into named regions based on application usage in some embodiments. The NVRAM 204 is a contiguous block of reserved memory in the storage unit 152 DRAM 216, and is backed by NAND flash. NVRAM 204 is logically divided into multiple memory regions written for two as spool (e.g., spool_region). Space within the NVRAM 204 spools is managed by each authority 512 independently. Each device provides an amount of storage space to each authority 512. That authority 512 further manages lifetimes and allocations within that space. Examples of a spool include distributed transactions or notions. When the primary power to a storage unit 152 fails, onboard super-capacitors provide a short duration of power hold up. During this holdup interval, the contents of the NVRAM 204 are flushed to flash memory 206. On the next power-on, the contents of the NVRAM 204 are recovered from the flash memory 206.

As for the storage unit controller, the responsibility of the logical "controller" is distributed across each of the blades containing authorities 512. This distribution of logical control is shown in FIG. 4 as a host controller 402, mid-tier controller 404 and storage unit controller(s) 406. Management of the control plane and the storage plane are treated independently, although parts may be physically co-located on the same blade. Each authority 512 effectively serves as an independent controller. Each authority 512 provides its own data and metadata structures, its own background workers, and maintains its own lifecycle.

Figure 5:
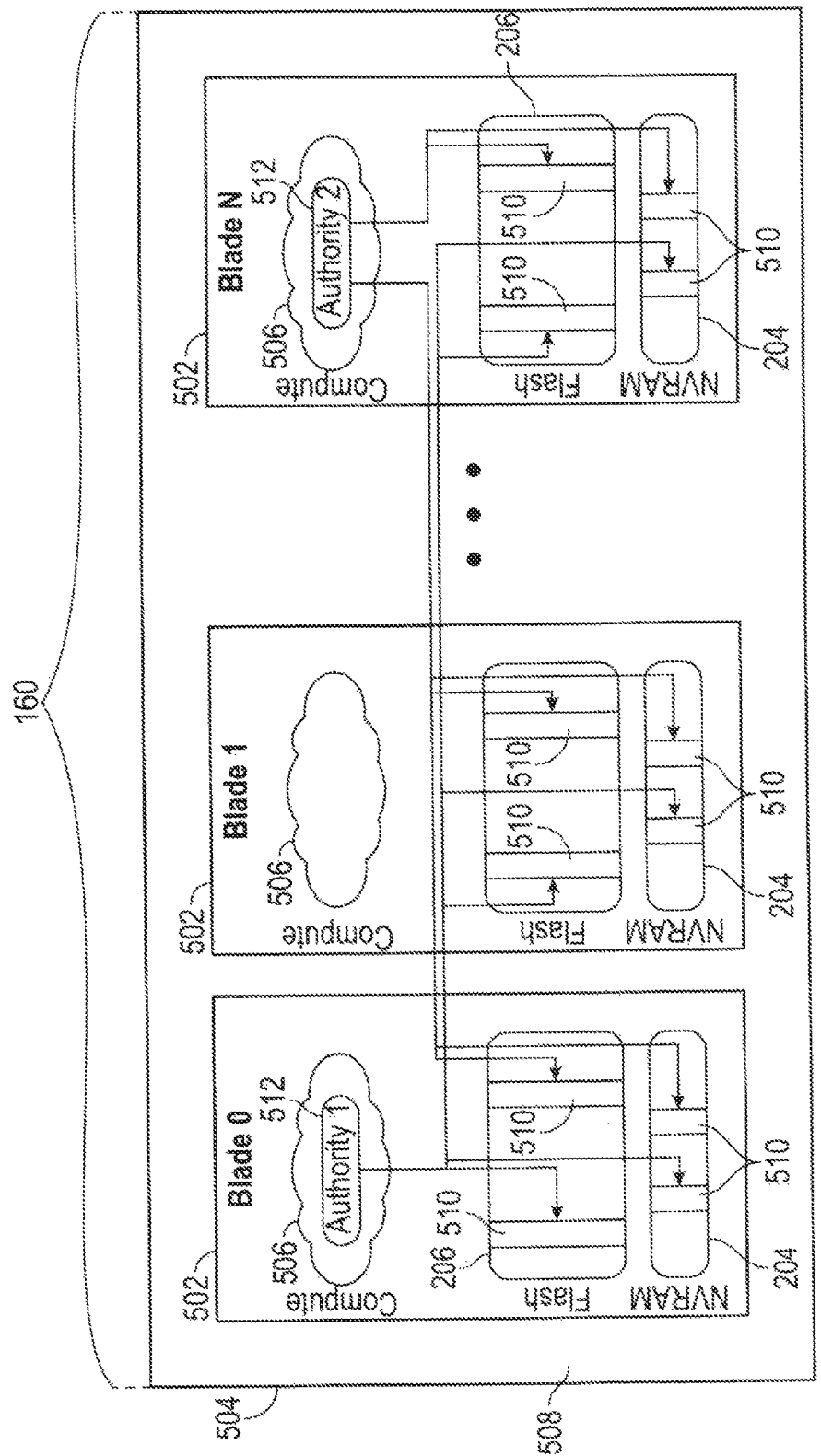
FIG. 5 is a blade hardware block diagram, showing a control plane, compute and storage planes, and authorities interacting with underlying physical resources to perform distributed transactions, using embodiments of the storage nodes and storage units of FIGS. 1-3 in the storage server environment of FIG. 4 in accordance with some embodiments.

FIG. 5 is a blade 502 hardware block diagram, showing a control plane 504, compute and storage planes 506, 508, and authorities 512 interacting with underlying physical resources to perform distributed transactions, using embodiments of the storage nodes 150 and storage units 152 of FIGS. 1-3 in the storage server environment of FIG. 4. The control plane 504 is partitioned into a number of authorities 512 which can use the compute resources in the compute plane 506 to run on any of the blades 502. The storage plane 508 is partitioned into a set of devices, each of which provides access to flash 206 and NVRAM 204 resources. In the compute and storage planes 506, 508 of FIG. 5, the authorities 512 interact with the underlying physical resources (i.e., devices). From the point of view of an authority 512, its resources are striped over all of the physical devices. From the point of view of a device, it provides resources to all authorities 512, irrespective of where the authorities happen to run. In order to communicate and represent the ownership of an authority 402, including the right to record persistent changes on behalf of that authority 402, the authority 402 provides some evidence of authority ownership that can be independently verifiable. A token is employed for this purpose and function in one embodiment, although other techniques are readily devised.

Still referring to FIG. 5, each authority 512 has allocated or has been allocated one or more partitions 510 of storage memory in the storage units 152, e.g. partitions 510 in flash memory 206 and NVRAM 204. Each authority 512 uses those allocated partitions 510 that belong to it, for writing or reading user data. Authorities can be associated with differing amounts of physical storage of the system. For example, one authority 512 could have a larger number of partitions 510 or larger sized partitions 510 in one or more storage units 152 than one or more other authorities 512. The above-described storage systems and storage clusters, and variations thereof, and various further storage systems and storage clusters are suitable for distributed flash wear leveling, as described below with reference to FIGS. 6-13. It should be appreciated that, although described with flash memory, the teachings herein are applicable to other types of solid-state memory and other types of storage memory.

Figure 6:
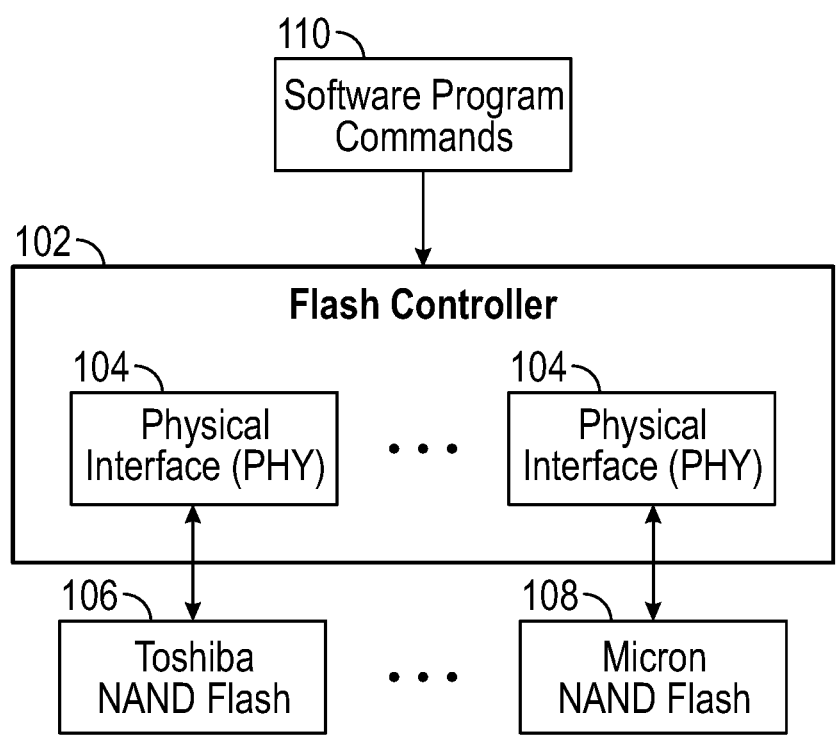
FIG. 6 depicts a flash controller that is configurable to couple to flash memories with differing flash memory device interfaces in accordance with some embodiments.
Figure 7:
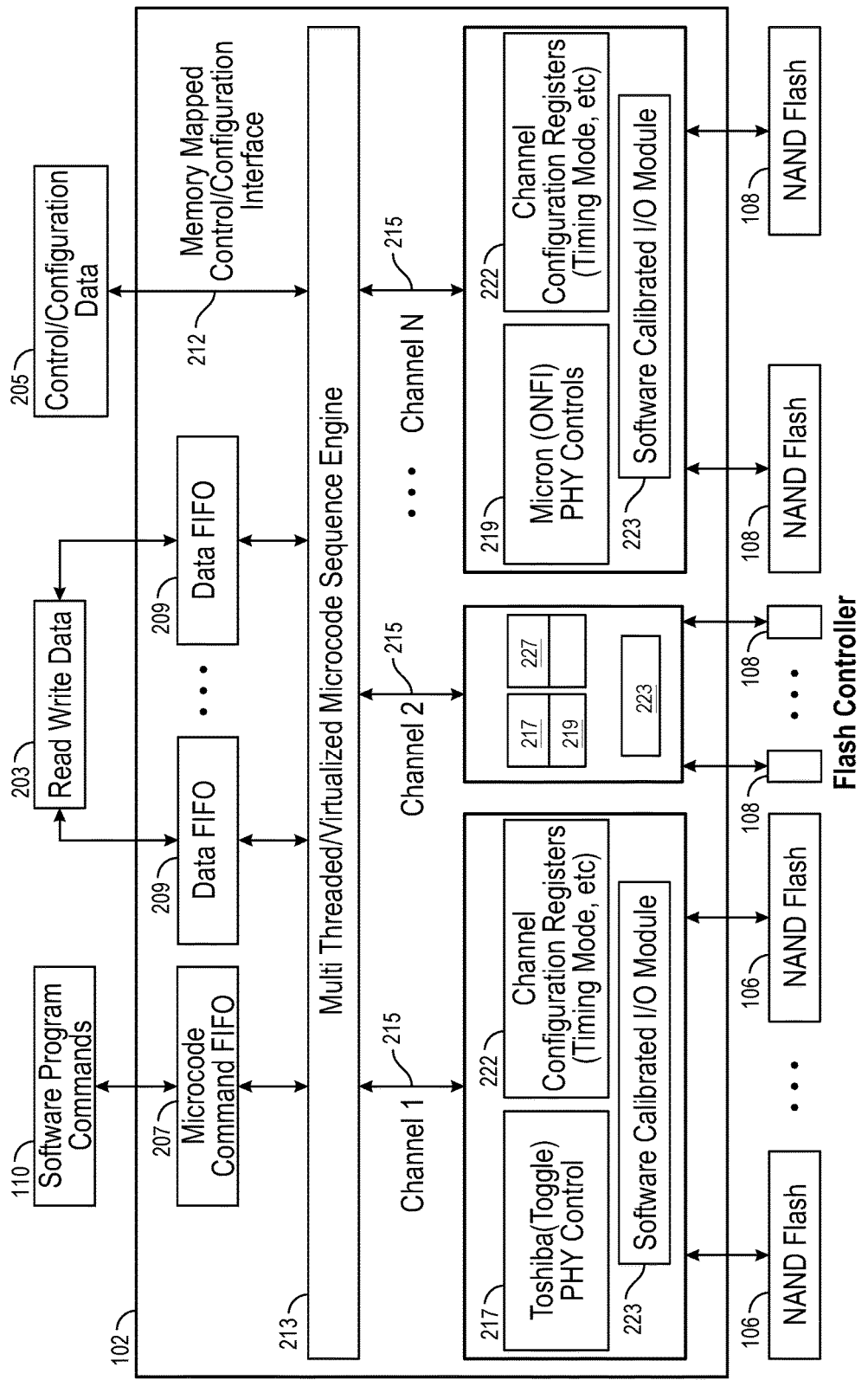
FIG. 7 is a block diagram showing structural details of an embodiment of the flash controller of FIG. 6, including a multithreaded/virtualized microcode sequence engine and multiple channels, each with phy controls, channel configuration registers and a software calibrated I/O module in accordance with some embodiments.

FIGS. 6 and 7 describe a multithreaded multimode NAND flash controller that can be used with multiple flash memory devices having the same or different flash memory interfaces, protocols, operating frequencies and/or signal timing, in various combinations and in various storage devices and systems. The flash controller can select from among multiple protocols, adjust and calibrate operating frequency and signal timing relative to each selected protocol and associated flash memory device interface, independently for each of multiple channels, and dynamically adapt signal rates to varying conditions that flash memory devices experience over time. Such tasks and capabilities are accomplished with a multithreaded and virtualized microcode sequence engine, individual channel configuration, and software calibrated I/O (input/output). Some embodiments can recalibrate signal rates (e.g., signal frequency and/or timing) to compensate for short-term drift the flash memory devices may experience as a result of environmental conditions such as temperature variation, power supply variation, noise, etc. Some embodiments can recalibrate signal rates to compensate for long-term drift or errors that flash memory devices may experience as a result of device wear arising from cumulative reads, cumulative writes, cumulative erasure cycles, etc.

There are fundamental differences between the ONFI and Toggle protocols in terms of physical flash signaling layer. The present flash controller design allows abstraction of much of the low-level complexity away from upper-level software. Upper-level software could, for example, issue "flash read" or "flash write" commands which in turn are processed differently by the controller depending upon the type of flash to which the controller is communicating. The physical controller could decode the command and translate the decoded command to the correct protocol, depending upon the type of flash and corresponding channel configuration.

FIG. 6 depicts a flash controller 102 that is configurable to couple to flash memories 106, 108 with differing flash memory device interfaces. In some embodiments, the flash controller 102 is implemented on a programmable logic device (PLD) or application-specific integrated circuit (ASIC), and includes a processor capable of multithreaded operation and various modules that can be implemented in circuitry, firmware, software executing on the processor, or various combinations thereof. Flash controller 102 corresponds to PLD 208 of FIG. 3 in some embodiments. Software program commands 110 are written into the flash controller 102, for example from an external device that has a processor. Each physical interface 104, or phy, is selectable as to protocol, operating frequency and signal timing, as appropriate to the specific NAND flash 106, 108 and associated flash memory device interface coupled to that physical interface 104. The physical interfaces 104 are independent of each other in the above and below-described selectability and tunability. In the example shown, one of the flash memory devices 106 is a Toshiba™ NAND flash, and another one of the flash memory devices 108 is a Micron™ NAND flash, but other flash memory devices from other manufacturers, or that have other flash memory interfaces and/or other protocols, could be used.

FIG. 7 is a block diagram showing structural details of an embodiment of the flash controller 102 of FIG. 6, including a multithreaded/virtualized microcode sequence engine and multiple channels, each with phy (physical) controls 217, 219, channel configuration registers 221 and a software calibrated I/O module 223. An embodiment of the flash controller 102 is depicted with N channels 215, which could be two channels, three channels, four channels, etc., i.e., for N greater than or equal to two up to however many channels can be physically produced on physical device(s) for the flash controller 102. Each channel 215 is independent of each other channel 215, as to flash memory protocol, operating frequency and/or signal rates of the flash memory device interface, and signal timing relative to the selected flash memory protocol. It should be appreciated that signal rate, as used herein, is inclusive of frequency and/or signal timing. In FIG. 7, the channel 215 labeled channel 1 is shown with Toshiba™ Toggle phy controls 217 (i.e., physical device controls for the Toggle protocol according to the Toshiba™ manufacturer flash devices), per the selected protocol for channel 1. Channel 1 is coupled to multiple NAND flash devices 106, which, in this example, are Toshiba™ flash memories that use the Toggle protocol. Channel configuration registers 221 for channel 1 are loaded with the appropriate values to direct the software calibrated I/O module 223 for channel 1 to time sequences in a protocol (e.g., by timing state machine states, microcode sequences or events, etc.) or to produce timed signals at a particular operating frequency (or signal rate) for the flash devices 106, in various embodiments. The above describes a process for how the channel configuration registers 221 are loaded, and a mechanism for how the software calibrated I/O module 223 generates timing for signal rates or generates signals in some embodiments.

Each channel 215 in the flash controller 102 has its own phy controls 217, 219, channel configuration registers 221 and software calibrated I/O module 223, the combination of which are selectable and tunable on an individual, per channel basis, as to protocol, operating frequency, and signal timing. The channel 215 labeled channel N is depicted as having Micron™ ONFI (Open NAND Flash Interface) phy controls 219 (i.e., physical device controls for the ONFI protocol according to the Micron™ manufacturer flash devices), per the selected protocol for channel N. Channel N is coupled to multiple NAND flash devices 108, which, in this example, are Micron™ flash memories that use the ONFI protocol. The flash controller 102 could be operated with flash devices 106 that are all the same (or flash devices 108 that are all the same, etc.), or mixes of flash devices 106, 108 of the various protocols, flash memory device interfaces and manufacturers. Each channel 215 should have the same flash memory devices across that channel 215, but which flash memory device and associated flash memory device interface that channel has is independent of each other channel.

Software program commands 110, which are device independent (i.e., not dependent on a particular flash memory protocol or flash memory device interface) are written by an external device (i.e., a device external to the flash controller 102), such as a processor, into the microcode command FIFO 207 of the flash controller 102. Read/write data 203 is read from or written into the data FIFOs 209. More specifically, write data intended for the flash memories is written into one or more write FIFOs, and read data from the flash memories is read from one or more read FIFOs, collectively illustrated as data FIFOs 209. A memory mapped control/configuration interface 211 is used for control/configuration data, which could also be from an external device such as a processor. The microcode command FIFO 207, the data FIFOs 209, and the memory mapped control/configuration interface 211 are coupled to the multithreaded/virtualized microcode sequence engine 213, which couples to the channels 215, e.g., channels 1 through N. Each channel 215 has a dedicated one or more threads, in a multithreaded operation of the multithreaded/virtualized microcode sequence engine 213. This multithreading virtualizes the microcode sequence engine 213, as if each channel 215 had its own microcode sequence engine 213. In further embodiments, there are multiple physical microcode sequence engines 213, e.g., in a multiprocessing multithreaded operation. This would still be considered an embodiment of the multithreaded/virtualized microcode sequence engine 213.

In some embodiments, state machines control the channels 215. These may act as the above-described virtualized microcode sequence engines 213. For example, in various embodiments, each channel has a state machine, or a state machine could control two channels, two state machines could control each channel, etc. These state machines could be implemented in hardware and fed by the multithreaded/virtualized microcode sequence engine 213, or implemented in threads of the multithreaded/virtualized microcode sequence engine 213, or combinations thereof. In some embodiments, software injects commands into state machine queues, and state machines arbitrate for channels, then issue read or write commands to channels, depending upon operations. In some embodiments, the state machines implement reads, writes and erases, with other commands such as reset, initialization sequences, feature settings, etc., communicated from an external processor along a bypass path which could be controlled by a register. Each state machine could have multiple states for a write, further states for a read, and still further states for erasure cycle(s), with timing and/or frequency (i.e., as affect signal rate) controlled by states, state transitions, and/or an embodiment of the software calibrated I/O module 223.

The microcode command FIFO 207 allows upstream logic to present transactions to the flash controller 102. The format of the command allows for the upstream logic to present entire transactions (with indicators for start of transaction, and end of transaction). The flash controller begins operating upon entire transactions on receipt of end of transaction markers, in some embodiments. In addition to the microcode command FIFO 207, there are two data FIFOs 209, and in some embodiments more than two, to handle data flowing in and out of flash. Also, there is a memory-mapped register interface 211 for the upstream logic to be able to program the different parameters used to set up the flash controller (e.g., calibration, flash mode, flash type, etc.) as described above. The embodiments described below provide for a process for how the channel configuration registers 220 are loaded, and a mechanism for how the software calibrated I/O module 222 generates timing for signal rates or generates signals in some embodiments, is further described below with reference to each of FIGS. 8-10.

Each channel 214 in the flash controller 102 has its own phy controls 216, 218, channel configuration registers 220 and software calibrated I/O module 222, the combination of which are selectable and tunable on an individual, per channel basis, as to protocol, operating frequency, and signal timing. The channel 214 labeled channel N is depicted as having Micron™ ONFI (Open NAND Flash Interface) phy controls 218 (i.e., physical device controls for the ONFI protocol according to the Micron™ manufacturer flash devices), per the selected protocol for channel N. Channel N is coupled to multiple NAND flash devices 108, which, in this example, are Micron™ flash memories that use the ONFI protocol. The flash controller 102 could be operated with flash devices 106 that are all the same (or flash devices 108 that are all the same, etc.), or mixes of flash devices 106, 108 of the various protocols, flash memory device interfaces and manufacturers. Each channel 214 should have the same flash memory devices across that channel 214, but which flash memory device and associated flash memory device interface that channel has is independent of each other channel.

Software program commands 110, which are device independent (i.e., not dependent on a particular flash memory protocol or flash memory device interface) are written by an external device (i.e., a device external to the flash controller 102), such as a processor, into the microcode command FIFO 206 of the flash controller 102. Read/write data 202 is read from or written into the data FIFOs 208. More specifically, write data intended for the flash memories is written into one or more write FIFOs, and read data from the flash memories is read from one or more read FIFOs, collectively illustrated as data FIFOs 208. A memory mapped control/configuration interface 210 is used for control/configuration data, which could also be from an external device such as a processor. The microcode command FIFO 206, the data FIFOs 208, and the memory mapped control/configuration interface 210 are coupled to the multithreaded/virtualized microcode sequence engine 212, which couples to the channels 214, e.g., channels 1 through N. Each channel 214 has a dedicated one or more threads, in a multithreaded operation of the multithreaded/virtualized microcode sequence engine 212. This multithreading virtualizes the microcode sequence engine 212, as if each channel 214 had its own microcode sequence engine 212. In further embodiments, there are multiple physical microcode sequence engines 212, e.g., in a multiprocessing multithreaded operation. This would still be considered an embodiment of the multithreaded/virtualized microcode sequence engine 212.

In some embodiments, state machines control the channels 214. These may act as the above-described virtualized microcode sequence engines 212. For example, in various embodiments, each channel has a state machine, or a state machine could control two channels, two state machines could control each channel, etc. These state machines could be implemented in hardware and fed by the multithreaded/virtualized microcode sequence engine 212, or implemented in threads of the multithreaded/virtualized microcode sequence engine 212, or combinations thereof. In some embodiments, software injects commands into state machine queues, and state machines arbitrate for channels, then issue read or write commands to channels, depending upon operations. In some embodiments, the state machines implement reads, writes and erases, with other commands such as reset, initialization sequences, feature settings, etc., communicated from an external processor along a bypass path which could be controlled by a register. Each state machine could have multiple states for a write, further states for a read, and still further states for erasure cycle(s), with timing and/or frequency (i.e., as affect signal rate) controlled by states, state transitions, and/or an embodiment of the software calibrated I/O module 222.

The microcode command FIFO 206 allows upstream logic to present transactions to the flash controller 102. The format of the command allows for the upstream logic to present entire transactions (with indicators for start of transaction, and end of transaction). The flash controller begins operating upon entire transactions on receipt of end of transaction markers, in some embodiments. In addition to the microcode command FIFO 206, there are two data FIFOs 208, and in some embodiments more than two, to handle data flowing in and out of flash. Also, there is a memory-mapped register interface 210 for the upstream logic to be able to program the different parameters used to set up the flash controller (e.g., calibration, flash mode, flash type, etc.) as described above and further described with reference to FIGS. 3-5. Operation of the microcode sequence engine 212 is further described in examples following the description of embodiments in FIGS. 3-6.

Figure 8:
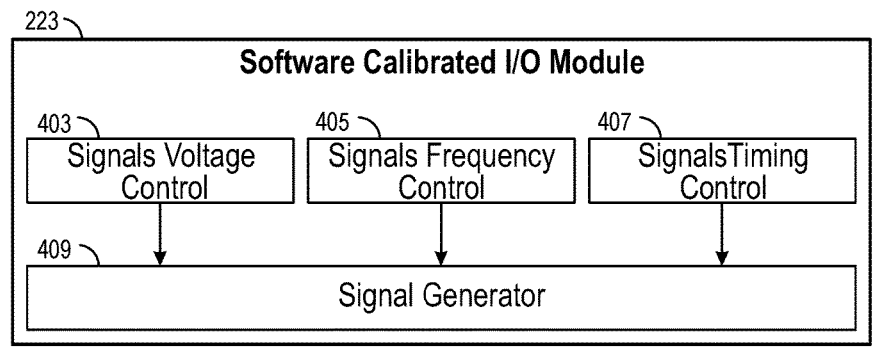
FIG. 8 is a block diagram showing structural details of an embodiment of the software calibrated I/O module of FIG. 7, in accordance with some embodiments.

FIG. 8 is a block diagram showing structural details of an embodiment of the software calibrated I/O module 223 of FIG. 7, including controls 403, 405, 407 for signal voltage, signal frequency and signal timing (all of which can be included under the term signal rate), and a signal generator 409. A signals voltage control 403 directs the voltage level(s) of one or more signals produced by the signal generator 409. A signal frequency control 405 directs the frequency or signal rate of one or more signals produced by the signal generator 409. A signals timing control 407 directs the timing of one or more signals produced by the signal generator 409. Each of these controls 403, 405, 407 has one or more registers, so that software can adjust and calibrate the signal generator 409 and the signals generated by the signal generator 409 by writing to these registers.

Figure 9:
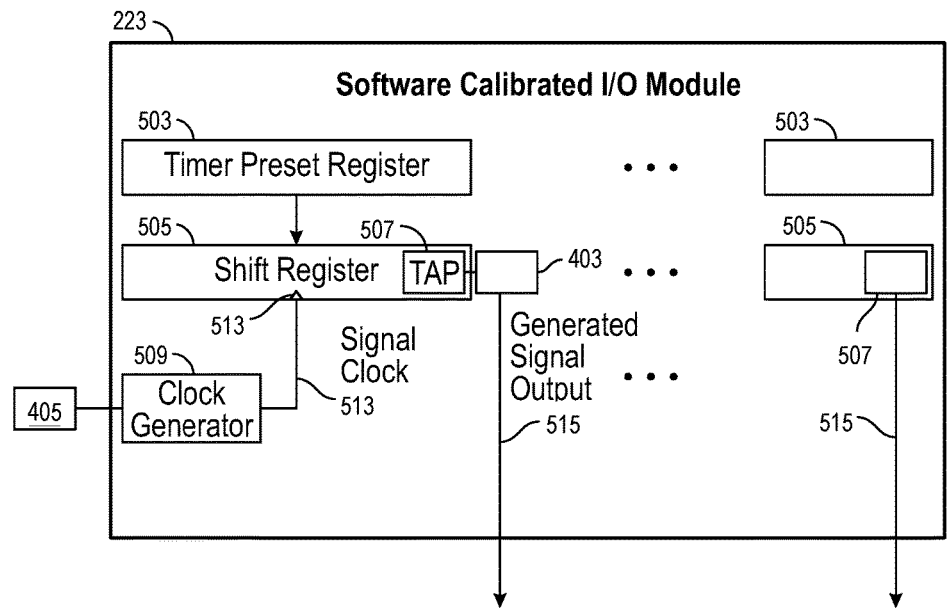
FIG. 9 is a block diagram showing structural details of a further embodiment of the software calibrated I/O module of FIG. 7, in accordance with some embodiments.

FIG. 9 is a block diagram showing structural details of a further embodiment of the software calibrated I/O module 223 of FIG. 7, including a timer preset register 503 coupled to a clocked shift register 505 that produces a generated signal output 515. Variations could couple the timer preset register 503 to the microcode sequence engine 213, or to a counter or other device that uses values in the timer preset register 503 to adjust a calibrate signal rate. In various embodiments, the software calibrated I/O module 223 could be used for timing the sequences in a protocol, or could be used for adjusting timing or frequency in a waveform at a flash memory device interface. For example, the software calibrated I/O module 223 could time microcode sequences in a read command, or a write command, to set timing from one output to an expected input, etc. Various embodiments of the software calibrated I/O module 223 could have one or more sets of these components, one set for each adjustable generated signal output 515. The timer preset register 503 is written with a value appropriate to determine the shape and edge placement of signal edges, i.e., determine the signal waveform, in the generated signal output 515, which is produced by the shift register 505. The shift register 505 has a clock input 513 to which a signal clock 511 is applied, which operates the shift register and shifts out the generated signal output 515 from a tap 507 of a bit in the shift register 505. Frequency of the signal clock 511 is determined by the clock generator 509, which is directed by the signal frequency control 405 (see FIG. 9). In various embodiments, the clock generator 509 could be a divider that divides down from a high-frequency clock, a clock multiplier that multiplies up from a lower frequency clock, a phase locked loop (PLL), a multiplexor that selects from multiple clock frequencies, or other clock circuit readily devised in keeping with the teachings herein. By this mechanism, the operating frequency or signal rate of the generated signal output 515 can be adjusted or calibrated, relative to the selected protocol and the associated flash memory device interface. As an alternative, the generated signal output 515 could be produced by an analog delay line, and this could be voltage controlled, or paired with a phase locked loop. Various further embodiments that produce a generated signal output 515, using clocked digital logic, asynchronous digital logic such as one shots or stable circuits, or analog circuitry with voltage tunable delays (e.g., voltage tunable resistance in an RC delay circuit) are readily devised. In some embodiments, the tap 507 could be selectable as to which bit of the shift register 505 produces the generated signal output 515, e.g., using a selector or multiplexor. The tap 507 of the shift register 505 has a controlled voltage output, in some embodiments, directed by the signals voltage control 403. For example, the power supply voltage(s) of an output inverter or buffer could be selectable or tunable, or a voltage controlled amplifier could be used to drive the generated signal output 515. Various digital and analog circuits for controlling voltage levels are readily applied to the output of the shift register 505, or other mechanism that produces the generated signal output 515, in keeping with the teachings herein.

Figure 10:
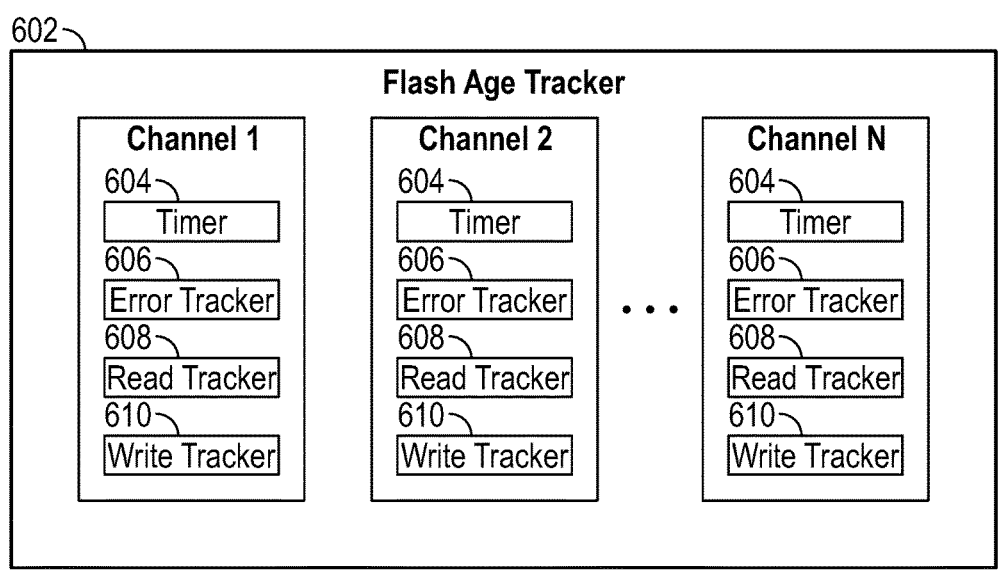
FIG. 10 is a block diagram of a flash age tracker, suitable for embodiments of the flash controller of FIG. 6, and usable to guide calibration of the signals by the software calibrated I/O module of FIGS. 7-9 in accordance with some embodiments.

FIG. 10 is a block diagram of a flash age tracker 602, suitable for embodiments of the flash controller 102 of FIG. 6, and usable to guide calibration of the signals by the software calibrated I/O module 223 of FIGS. 7, 9 and 10 in some embodiments. The flash controller 102, when equipped with a flash age tracker 602, monitors various aspects of the age of the flash memories on a per channel basis. Each channel could have a timer 604, an error tracker 606, a read tracker 608 and/or a write tracker 610, in various combinations. The timer 604 would count the total amount of time (could be hours or days, etc.) that the flash memory devices coupled to that channel 215 are in operation. The error tracker 606 could count errors, or determine error rates, and watch for degradation in the data that is read from the flash memory devices of that channel 215. The read tracker 608 could count the total number of reads of flash memory devices of that channel 215, to various levels of granularity (e.g., per address range, per die, or for the entire group for that channel 215). The write tracker 610 similarly could count the total number of writes of flash memory devices of that channel 215, to similar various levels of granularity. Depending on which, or which combination, of these is monitored in the flash age tracker 602, the multithreaded/virtualized microcode sequence engine 213 could determine that an adjustment should be made to the frequency of operation, signal timing, or signal voltage(s) of one or more signals generated by the software calibrated I/O module 223. This could be an iterative process, with adjustments made to one or more of these, and then error rates or error counts monitored, with decision to make further adjustments or not.

With reference to FIGS. 6-10, operation of the microcode sequence engine 213 is described in examples below. It should be appreciated that these are examples only, and the operation of the microcode sequence engine 213 is not limited to these examples. Specific coding, and variations, further sequences, and further operations and scenarios are readily devised in keeping with the teachings herein. In one example, the microcode sequence engine 213 has preloaded code and/or downloadable code. The code can perform phy calibration, or can be directed by external software operating on an external processor to perform calibration of the software calibrated I/O module 213 and one or more signals generated for each channel 215. Calibration can be performed initially, and periodically thereafter. The signals can be dynamically adjusted by the microcode sequence engine 213, responsive to operating time, errors, numbers of reads or writes per the flash age tracker 602 or other stimulus. Multi-moded calibration can be performed for each channel independently, and each channel can have a different signal rate (i.e., operating frequency for the channel, per the selected protocol for the channel and the associated flash memory device interface).

The following is an example of a read data command. This involves sending the flash a specified command value, followed by a specified address value. The sequence of events, performed by an external device such as a processor in communication with the flash controller 102, is:

1. Program a timer preset register 503 for a specified channel 215 via the register interface (e.g., memory mapped control/configuration interface 211) with a value for the timing delays that need to be observed for a specified signal during the read operation.
2. Formulate a specified microcode, to start the transaction, and send the microcode to the microcode command FIFO 207 (e.g., as a software program command 110).
3. Formulate a specified microcode, with a specified address and a number of address beats=0, and send to the microcode command FIFO 207.
4. Formulate a specified microcode to point to the timer preset register 503 for the specified channel 215 programmed earlier, with a timer preset of 1, the number of data beats=6, data direction=input (e.g., relative to the flash controller 102), end of transaction=1, and send to the microcode command FIFO 2076.

The flash controller 102 waits for the transaction to be programmed in its entirety before beginning to operate on it in some embodiments. The flash controller 102 parses the three microcode entries, and generates the correct signals on the bus between the flash memory controller 102, which could be implemented on an FPGA (field programmable gate array), and the particular flash memory device 106 on the selected channel 215. In some embodiments, both start and end of transaction markers are referenced. In some embodiments only the end of transaction markers are referenced, with the start of transaction markers being implicit. Exact sequencing on the selected channel 215 would then look like the signals seen on a datasheet from a flash memory vendor.

In some embodiments, the calibration logic is split between programmable logic (e.g., implemented in Verilog on an FPGA that implements the flash controller 102), and software that runs on a processor, external to the flash controller 102. This external software could enter in calibration values (e.g., through the memory mapped control/configuration interface 211), which changes the behavior of the calibration logic (e.g., the software calibrated I/O module 223). The external software then monitors the fidelity of the data coming back from the bus (e.g., by monitoring errors in the read data), and running through various calibration points before settling on an optimal setting for each channel 215. This could be accomplished with an embodiment of the flash age tracker 602, either internal to the flash controller 102, or external to the flash controller, e.g., coupled to the external processor.

Figures 11A, 11B:
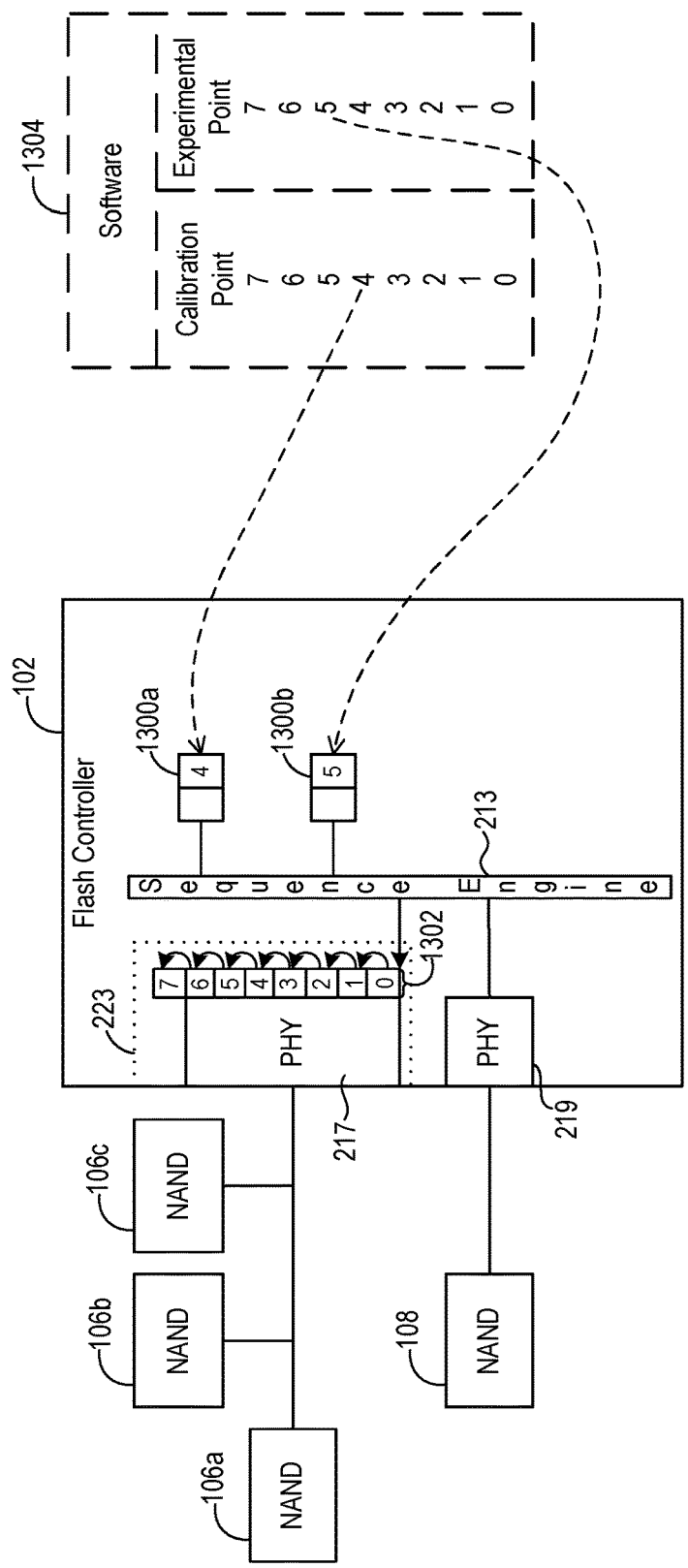
FIGS. 11A and 11B illustrate a flash controller having a double buffer for calibration points in accordance with some embodiments.

FIG. 11A illustrates a flash controller having a double buffer for calibration points in accordance with some embodiments. The flash controller and NAND flash parts are mounted on a printed circuit board (PCB) board and connected via conductive traces. This physical connection is referred to as channel (see FIG. 7) and contains a certain number of wires connecting controller pins and NAND flash part pins. In order to enable reliable transmission from the flash memory to the controller, signals transmitted over a channel must be sampled at appropriate time in the controller. The correct sampling time depends on the frequency of the data transmission, pin capacitance of the NAND flash parts, number of the NAND flash parts connected to the same set of controller pins, temperature and process-voltage-temperature (PVT) characteristics of the flash controller. The flash calibration mechanism described herein enables a flexible, programmable technique to pick a sampling point that provides best signal integrity and minimizes number of errors. Data transmitted over the channel should be error free when a sampling point is chosen correctly. In order to find a correct sampling point the calibration algorithm transmits a known data sequence from the NAND part (i.e., flash memory) to the flash controller 102 and counts the number of errors in the received data sequence compared to the known data sequence. In some embodiments an oversampling technique is employed to perform the sampling. The calibration algorithm repeats this procedure for a predetermined set of calibration points and creates the table of sample points with number of errors smaller than a chosen threshold. For example, shift registers 1302 include a set of eight registers (numbered 0-7). Shift registers 1302 provide a set of calibration points shifted over times. In some embodiments, a multiplexer, or some other selection mechanism may be employed to select between the shift registers 1302. Software can then select the different calibration points and determine which points provide the best data. For example, the embodiments can employ a low density parity check code with each calibration data point to get correctable data and then determine which calibration point provides the best data. A final calibration point is chosen as the middle point among the sampling points in the table of sample points in some embodiments.

Figure 12:
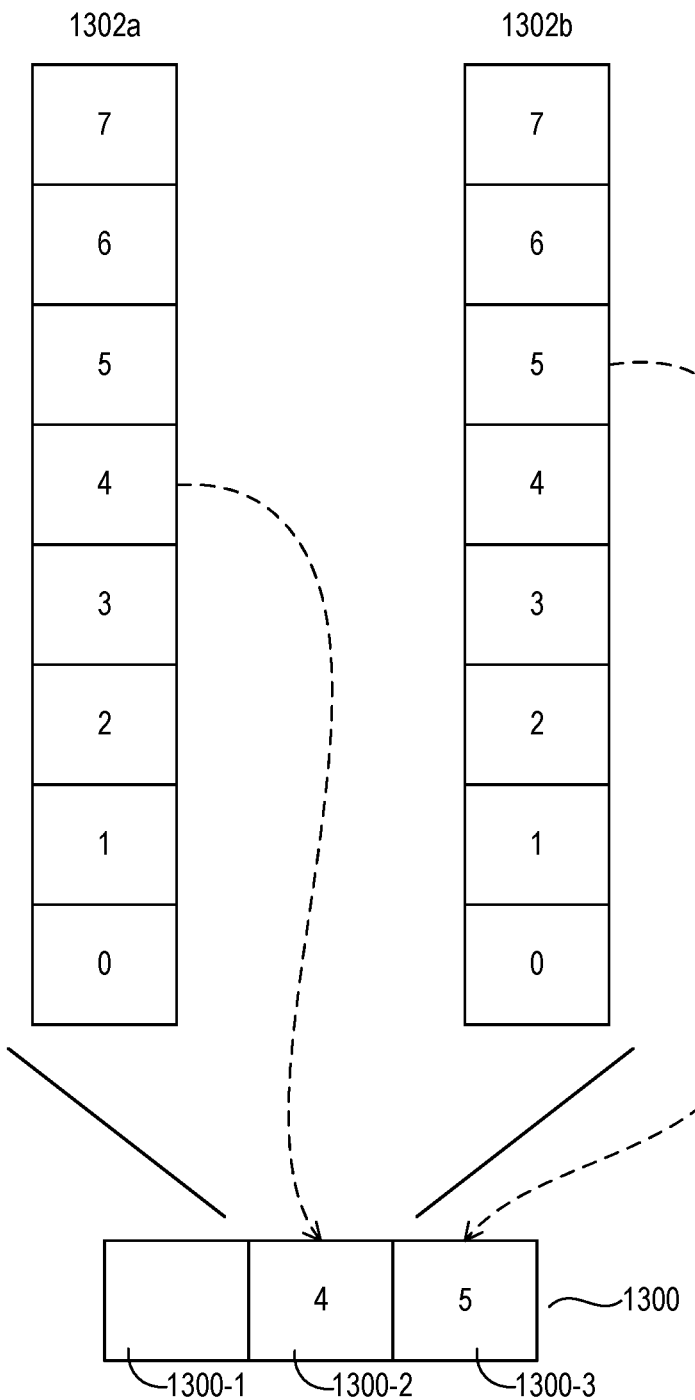
FIG. 12 illustrates a double buffer that may be utilized for calibration of a solid state device in accordance with some embodiments.

In FIG. 11B, the embodiments also provide for continual calibration checking with software 1304. Software 1304 performs the initial calibration as described herein and in one example determines that the calibration settings associated with sample point 4 is optimal. In the background, software 1304 can continual check/update the settings and provide an experimental set of calibration points. Not only could the embodiments be utilized for continued updating of the calibration, but the embodiments may be utilized for providing further granulation over a channel having multiple flash memory or NAND devices on a channel. In addition, the embodiments guarantee a non-disruptive NVRAM 204 dump as described below. During the normal operations of the storage system, there are times when software activities might involve changing the calibration values, i.e., when the impact of temperature changes over the calibrated sample points become significant enough, a process of re-calibration might get started. In some embodiments, when a read-retry is needed (a process to retry a failed read w/different retry options), some retry options may also involve modifications to the calibrated points being made. The double buffer 1300 illustrated with regards to FIGS. 11A, 11B, and 12 ensure the non-disruptive NVRAM 204 dump. In FIGS. 11A and 11B, the optimal calibration setting is point 4 and the experimental value running in the background has identified point 5 as an optimal setting during the continuous monitoring. The initial optimal setting of point 4 is set in buffer 1300a and the experimental setting of point 5 is set into buffer 1300b. Buffers 1300a and 1300b of FIG. 11A may be combined into a single double buffer 1300 as illustrated in FIG. 12. It should be appreciated that without the double buffer 1300, when a power-loss happens, the experimental calibration points (from re-calibration or read-retry) will cause the flash status to indicate not properly sampled by the device, in turn causing a power-loss engine stuck and resulting in a failed NVRAM dump. That is, when a power-loss happens, software 1304 will be immediately blocked from any further register writes to change the calibration values.

Referring to FIGS. 11A, 11B and 12, with the double buffer 1300 of the calibration point, the front buffer 1300-2 (buffer 0) holds the reliable value, and the experimental values go to buffer1 1300-3. When an experimental value is proven final/matured, that experimental value is moved to buffer0 1300-2. Software 1304 has the ability to program buffer 0 1300-2 or buffer 1 1300-3, and also indicate at IOP or command level which buffer to use, for example, a read-retry may always use buffer1 1300-2 for both setting the value and referencing the values, and the experimental calibrated point could go to buffer0 1300-3 if there is enough justification in some embodiments. In the case of a power-loss, the power-loss engine will reference buffer0 1300-2, which guarantees the non-disruptive NVRAM dump.

Referring to FIGS. 11A and 11B, the calibrated points may be configured at channel level in some embodiments. In addition, in some embodiments, as there may be multiple NAND devices 106a-c on a channel, the embodiments provide for further granularity when communicating with the multiple NAND devices 106a-c on a channel. The experimental point in buffer 1300b may be associated with communications with NAND device 106b. In some embodiments a bit in a command register is set to associate the point 5 settings with communications with NAND device 106b. Thus, communication with NAND devices 106a and 106c utilize the settings for point 4, while point 5 settings are utilized for communications with NAND device 106b.

Referring to FIG. 12, for each channel, there is a register 1300, which has the following fields:
Calibration Done 1300-1 (this indicates if buffer0 has the valid setting, once initial calibration after power-on is done, this is set)
The calibration point for buffer0 1300-2
The calibration point for buffer1 1300-3

In the calibration process, when software 1304 experiments thru all the different calibration points, a selected point is programmed into buffer1 1300-3, and indicates in the read commands to use buffer1 1300-3. When the final calibration point is selected or identified, that point is programmed into buffer 0 1300-2. Similarly, during a read-retry, the calibration point of buffer1 1300-3 may be utilized. When power-loss happens, if the NVRAM dump is armed, i.e., after the initial calibration is done, the power-loss engine uses buffer 0 1300-2 when it needs to poll flash status. It should be appreciated that FIGS. 13 and 14 are examples and not meant to be limiting as alternative configurations for the double buffer and shift registers are possible as FIGS. 13 and 14A are illustrative for explanatory purposes.

Figure 13:
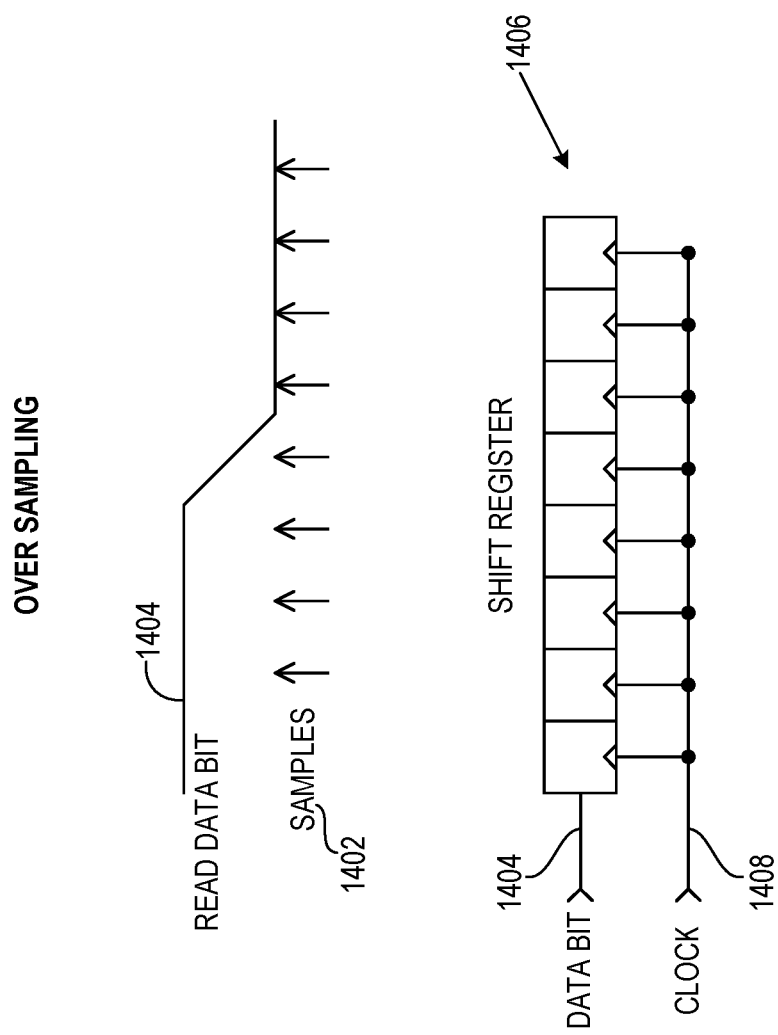
FIG. 13 illustrates oversampling a read data bit, with a shift register as used to determine calibration points in accordance with some embodiments.

FIG. 13 illustrates oversampling a read data bit 1404, with a shift register 1406 as used to determine calibration points in some embodiments. Oversampling applies multiple samples 1402 to the data bit 1404, so that oversampling mechanisms such as the shift register 1406 can accurately observe and record a transition in the value of the data bit 1404 and determine when the data bit 1404 reaches a stable output value. Further oversampling mechanisms, and variations of the shift register 1406, are readily devised in keeping with the teachings herein. A clock 1408 is applied to the clock input of the shift register 1406. The shift register 1406 clocks in the data bit 1404, sampling the data bit 1404 at each of the sample points or samples 1402. By using a sufficiently fast clock 1408, the shift register 1406 can sample the data bit 1404 for example two, eight, sixteen or some other number of times, and capture the digital values of the data bit before, after, and perhaps even during the transition to a valid output value (in this case, reading a zero). One method the system could use to analyze the oversampled data bit 1404 is to look at the changes or transitions in captured bit value from one stage to the next in the shift register 1406, looking for the transition and stable value after the transition. This analysis could be performed in software executing on a processor, firmware or hardware. The earliest possible calibration point for reading valid data could then be selected from the number of clock cycles that has occurred since the start of sampling in the read cycle until the bit value on the read data bit 1404 is stable at a valid value for the read. Variations on this analysis could select a calibration point that is in the middle of the stable values for the read, the earliest stable value for the read, one or more safety clock cycles after the earliest stable value for the read, or other sample point related to the stable values for the read. Statistical analysis, interpolation, and other signal analysis techniques could be applied in further embodiments. Also, the range of timing values used in the oversampling can be reduced from a wider range to a narrow range of timing values in further calibration updates or determinations. The reduced range could be centered on one of the calibration points, for example the calibration point in the buffer0 1300-2 as shown in FIG. 12. Selection of the sampling points and calibration value can also be coordinated with the error count analysis as described above with reference to FIGS. 11A and 11B and below with reference to FIG. 14.

With reference to FIGS. 7-13, a flash controller 102 with the multithreaded virtualized microcode sequence engine 213 of FIG. 7 and FIGS. 11A and 11B has the software calibrated I/O module 223 of FIGS. 8 and 9 and the phy controls 217, 219 of FIGS. 7 and 11A and 11B. The flash controller 102 also has the buffers 1300a, 1300b of FIGS. 11A and 11B or double buffer 1300 of FIG. 12, which the software calibrated I/O module 223 of FIG. 9 uses to produce the generated signal output(s) 515 for the channel(s) 215 of the flash controller 102. Calibration for the generated signal output 515 is performed using the oversampling and shift register 1406 of FIG. 13, and one of the methods described below with reference to FIGS. 14 and 15 with the determined calibration point loaded into the buffers 1300a, 1300b or double buffer 1300 as described above. Age tracking, as determined by the flash age tracker 602 of FIG. 10, can be used as a trigger for initiating a calibration operation.

Figure 14:
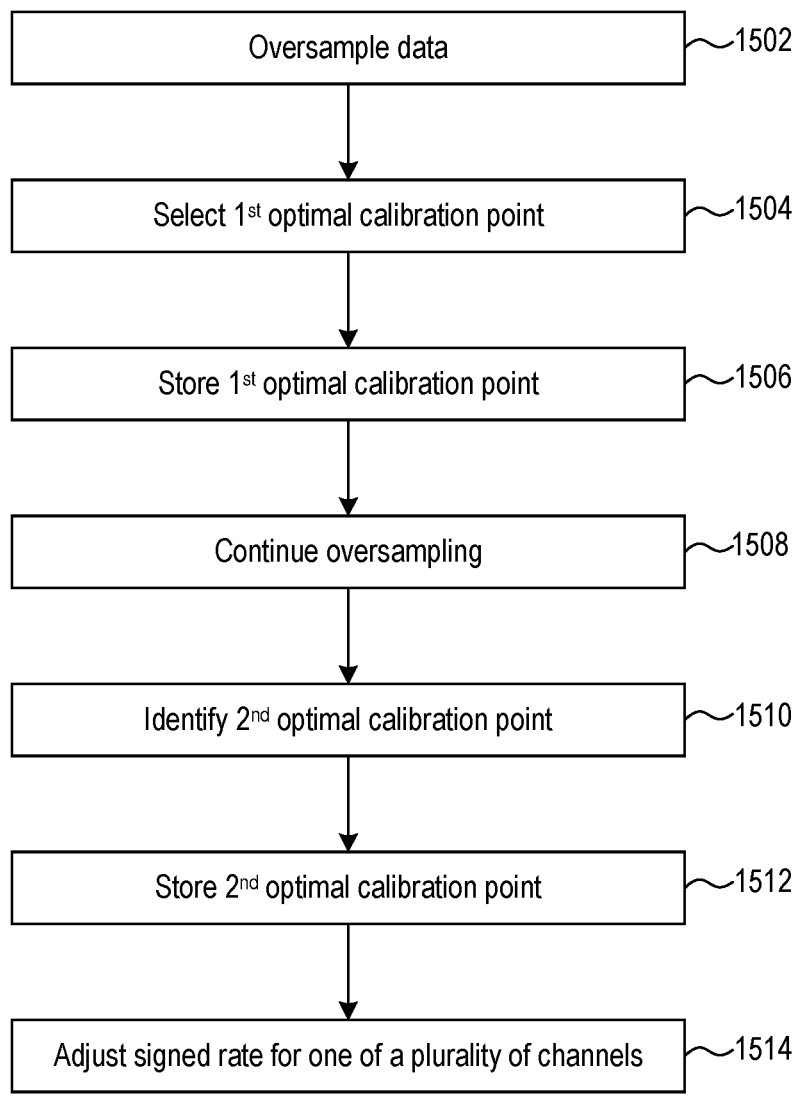
FIG. 14 is a flowchart illustrating method operations for calibration of flash channels in a memory device in accordance with some embodiments.

FIG. 14 is a flowchart illustrating method operations for calibration of flash channels in a memory device in accordance with some embodiments. For illustrative purposes it is assumed that a flash controller has 2^n channels (e.g., 16) and that each controller channel is connected to 2^m NAND flash parts (e.g., 4) identified by chip enable pins. Each NAND flash part internally has many physical dies/LUNS (logical unit numbers) connected to the NAND flash part pins (e.g., four LUNs per chip enable). Before the flash controller can successfully operate a reliable communication path between controller and each NAND flash part die must be established. Flash channel calibration is a first operation performed by the flash controller after power on and NAND flash part reset in some embodiments. Frequency of the sampling clock is 2×-8× higher than the frequency of the data transfer in order to provide sufficient sampling resolution, i.e., oversampling is utilized. In some embodiments, the sampling window of the flash channel calibration is at least one period of the data transfer frequency. In the embodiment described below, data is written to and read from an LUN cache register in the NAND flash die for a particular LUN and associated chip enable, so that calibration does not need to write to flash memory itself. In further embodiments, data could be read directly from the flash memory, with a known pattern for ROM error pages being read out and used for calibration purposes, or a known pattern programmed into the flash memory and read out. The flash channel calibration algorithm is described by following pseudo-code:

```
for channel=1 to 2^n
  for chip_enable=1 to 2^n
    for lun=1 to #luns per ce
      write known data sequence to LUN cache register
      for sample_point=1 to #max_sample_points
        read LUN cache register
        count errors in received data, #err_cnt
        if #err_cnt<threshold
          add sample point to list of valid samples
        end
      end
    end
end
from list of valid samples create a list of samples that work for all chip_enable and LUN
``` pick the middle sample from the list as a final calibration point for a channel and store it in a register end The basic flash channel calibration algorithm can be improved to run faster as described below in some embodiments. For the first channel, execute the flash channel calibration algorithm as described above and find a final calibration point. Since flash channels should not vary by much the sample point search for all other channels can be concentrated around final calibration point of the first channel in this embodiment. The sample_point range can be final_sample_point_channel0−2 to final_sample_point_channel0+2 instead of 1 to #max_sample_points.

FIG. 14 initiates with operation 1502 where the data is over sampled. As mentioned above the data may be sampled at a frequency of 2-8 times higher than the data transfer rate in some embodiments. A first optimal calibration point may be selected in operation 1504. The first optimal calibration point is stored in a first buffer in operation 1506. Oversampling is continued in the background as described above in operation 1508. A second optimal calibration point may be selected in operation 1510. The second optimal calibration point is stored in a second buffer in operation 1512, as described above with reference to FIGS. 11A, 11B and 12. The signal rate for a channel or for one device of a plurality of devices may be adjusted according to the second calibration point in operation 1514. The external environmental conditions may have changed for the entire channel in some embodiments. One device may communicate better according to the second calibration point as mentioned above in some embodiments. It is possible that due to temperature changes channel parameters change and a channel loses synchronization as the currently selected calibration point creates large number of errors during transmission. In this case, flash channel calibration can provide an option to store a shadow calibration value in an additional register. The value in a shadow register or double buffer value can be used instead of the value in the main calibration register to provide reliable transmission while the external environment condition exists. The embodiments also provide for the quick recovery from a power loss as the calibration value for the optimal calibration point can be utilized when powering up from a power loss as mentioned above.

Figure 15:
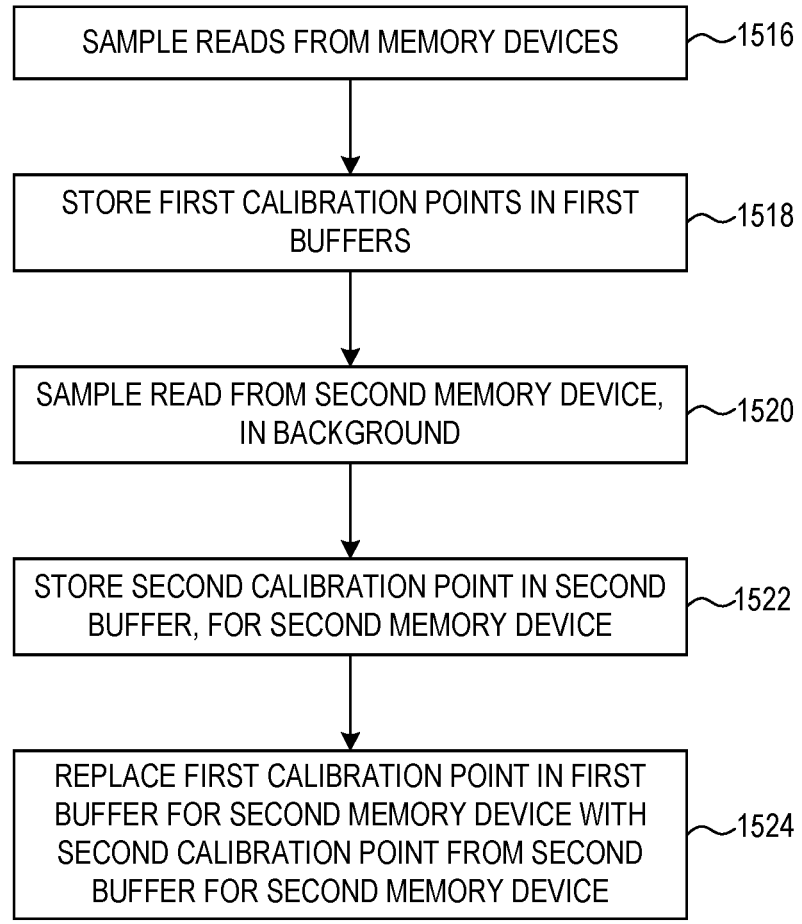
FIG. 15 is a flowchart illustrating a further method for calibration of flash channels in a memory device in accordance with some embodiments.

FIG. 15 is a flowchart illustrating a further method for calibration of flash channels in a memory device in accordance with some embodiments. The method can be practiced by one or more processors in a storage system, more specifically by a processor executing software, firmware, or hardware and various combinations thereof in a storage system. In an action 1516, reads from memory devices are sampled. Oversampling, as described above is used in various embodiments. In an action 1518, first calibration points are stored in first buffers. In some embodiments, each of multiple chip enables of solid-state storage memory has an associated first buffer and second buffer. In other embodiments, each LUN of solid-state storage memory has an associated first buffer and second buffer. In an action 1520, a read from a second memory device is sampled in background. In an action 1522, a second calibration point is stored in a second buffer, for the second memory device. In an action 1524, the first calibration point in the first buffer for the second memory device is replaced with the second calibration point from the second buffer for the second memory device.

Figure 16:
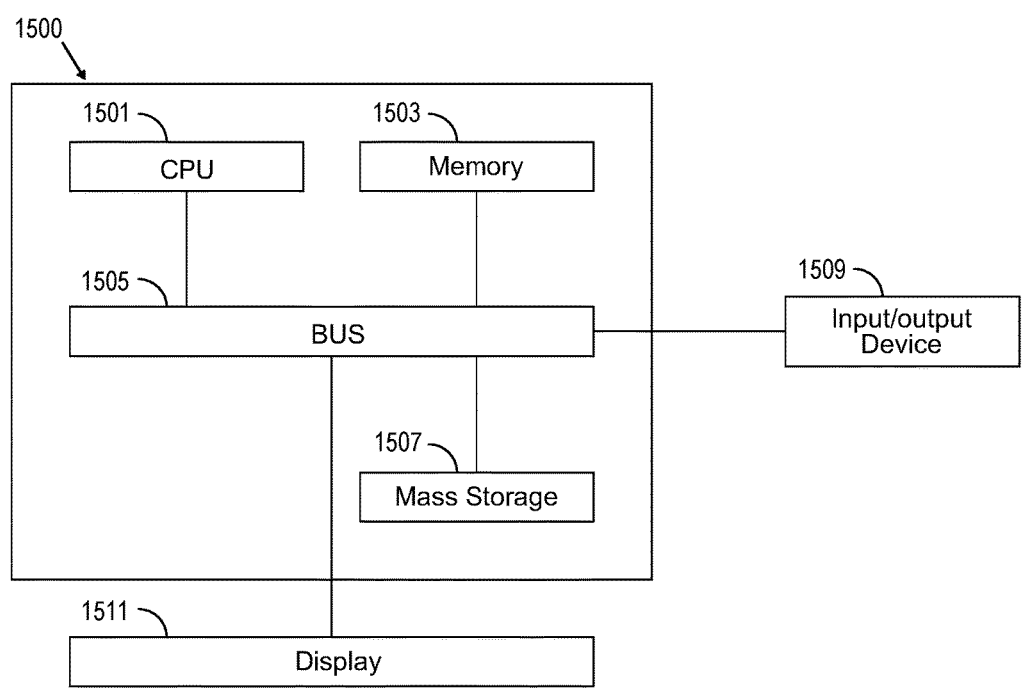
FIG. 16 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 16 is an illustration showing an exemplary computing device which may implement the embodiments described herein. The computing device of FIG. 16 may be used to perform embodiments of the functionality for an external processor (i.e., external to the flash controller) or the multithreaded/virtualized microcode sequence engine (internal to the flash controller) in accordance with some embodiments. The computing device includes a central processing unit (CPU) 1501, which is coupled through a bus 1505 to a memory 1503, and mass storage device 1507. Mass storage device 1507 represents a persistent data storage device such as a disc drive, which may be local or remote in some embodiments. The mass storage device 1507 could implement a backup storage, in some embodiments. Memory 1503 may include read only memory, random access memory, etc. Applications resident on the computing device may be stored on or accessed via a computer readable medium such as memory 1503 or mass storage device 1507 in some embodiments. Applications may also be in the form of modulated electronic signals modulated accessed via a network modem or other network interface of the computing device. It should be appreciated that CPU 1501 may be embodied in a general-purpose processor, a special purpose processor, or a specially programmed logic device in some embodiments.

Display 1511 is in communication with CPU 1501, memory 1503, and mass storage device 1507, through bus 1505. Display 1511 is configured to display any visualization tools or reports associated with the system described herein. Input/output device 1509 is coupled to bus 1505 in order to communicate information in command selections to CPU 1501. It should be appreciated that data to and from external devices may be communicated through the input/output device 1509. CPU 1501 can be defined to execute the functionality described herein to enable the functionality described with reference to FIGS. 1-15. The code embodying this functionality may be stored within memory 1503 or mass storage device 1507 for execution by a processor such as CPU 1501 in some embodiments. The operating system on the computing device may be MS-WINDOWS™, UNIX™, LINUX™, iOS™, CentOS™, Android™, Redhat Linux™, z/OS™, or other known operating systems. It should be appreciated that the embodiments described herein may also be integrated with a virtualized computing system implemented with physical computing resources.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a tangible non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand. The service provider may host the software, or may deploy the software to a customer for a given period of time. Numerous combinations of the above models are possible and are contemplated.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A method for communicating with memory, performed by a memory controller, the method comprising:
   sampling reads from a plurality of memory devices;
   storing first calibration points in first buffers, based on the sampling, with at least one first calibration point and corresponding first buffer for each of the plurality of memory devices;
   sampling a read from a second memory device in background while performing a read from a first memory device using the first calibration point in the first buffer corresponding to the first memory device;
   storing a second calibration point in a second buffer, for the second memory device, based on the sampling in the background, with the first buffer for the second memory device having the first calibration point used for ongoing reads of the second memory device;
   dumping at least the first calibration points from the plurality of first buffers to a memory, responsive to a power loss; and
   retrieving at least the first calibration points from the memory in recovering from the power loss, and using the first calibration points in the first buffers for further reads from the plurality of memory devices.

2. The method of claim 1, further comprising:
   replacing the first calibration point in the first buffer for the second memory device with the second calibration point from the second buffer for the second memory device.

3. The method of claim 1, wherein the storing the first calibration points in the first buffers comprises:
   storing in the first buffers a first calibration point for each of a plurality of chip enables of the plurality of memory devices, with at least one first buffer for each chip enable in the plurality of memory devices.

4. The method of claim 1, further comprising:
   reducing from a first range of timing values during the sampling to a second range of timing values.

5. The method of claim 1 wherein the sampling, for each read for calibration, comprises:
   oversampling a read from one of the plurality of memory devices, into a shift register, at a frequency higher than a data transfer frequency.

6. The method of claim 1, wherein the storing the first calibration points in the first buffers comprises:
   storing in the first buffers a first calibration point for each of a plurality of logical units (LUNs) of the memory devices, each first buffer corresponding to a logical unit.

7. A tangible, non-transitory, computer-readable media having instructions thereupon which, when executed by a processor, cause the processor to perform a method comprising:
   determining first calibration points for a plurality of memory devices, based on sampling reads from the plurality of memory devices;
   writing the first calibration points into a plurality of first buffers associated with the plurality of memory devices;
   determining a second calibration point for a second one of the plurality of memory devices, based on sampling a read from the second one of the plurality of memory devices in background during a read of a first one of the plurality of memory devices using the first calibration point in the first buffer corresponding to the first memory device;
   writing the second calibration point into one of a plurality of second buffers, in association with the second one of the plurality of memory devices, with the first calibration point in one of the plurality of first buffers in association with the second one of the plurality of memory devices used for at least one read of the second one of the plurality of memory devices;

writing the first calibration points to a memory, responsive to a power loss;

recovering the first calibration points from the memory to the plurality of first buffers, responsive to recovering from the power loss;

performing reads from the plurality of memory devices using the first calibration points from the plurality of first buffers, responsive to the recovering from a power loss.

8. The computer-readable media of claim 7, wherein the method further comprises:

overwriting the first calibration point in the one of the plurality of first buffers in association with the second one of the plurality of memory devices, with the second calibration point from the one of the plurality of second buffers.

9. The computer-readable media of claim 7, wherein the writing the first calibration points into the plurality of first buffers comprises:

writing each first calibration point into one of the plurality of first buffers, in association with one of a plurality of chip enables or logical unit numbers (LUNs) of the plurality of memory devices.

10. The computer-readable media of claim 7, wherein the method further comprises:

using a first range of timing values in the sampling and the determining the first calibration points; and reducing from the first range of timing values to a narrower second range of timing values in the sampling.

11. The computer-readable media of claim 7, wherein the method further comprises:

sampling the reads from the plurality of memory devices, at a frequency higher than a data transfer frequency.

12. A memory controller, comprising:

a plurality of first buffers;

a plurality of second buffers; and hardware, firmware, or a processor, configured to perform a method comprising:

sampling reads from a plurality of memory devices;

writing first calibration points, for the reads, based on the sampling, into the plurality of first buffers;

performing a read from a first memory device, using the first calibration point in the first buffer associated with the first memory device;

sampling, in background, a read from a second memory device;

writing a second calibration point, based on the sampling in the background, into one of the plurality of second buffers;

performing a read from the second memory device, using the first calibration point in the first buffer associated with the second memory device;

dumping contents of the first and second buffers to a memory, responsive to a power loss;

retrieving and using the first calibration points in the plurality of first buffers, for reading from the plurality of memory devices, to recover from the power loss.

13. The memory controller of claim 12, wherein the method further comprises:

writing the second calibration point from the one of the plurality of second buffers into the one of the plurality of first buffers holding the first calibration point for the second memory device.

14. The memory controller of claim 12, wherein each of the plurality of first buffers is associated with one of a plurality of chip enables of the plurality of memory devices.

15. The memory controller of claim 12, wherein the method further comprises:

reducing a range of timing values used in the sampling, from a wider range to a narrower range of timing values centered on one of the first calibration points.

16. The memory controller of claim 12, wherein the sampling the reads from the plurality of memory devices comprises oversampling at a higher frequency than a data transfer frequency.

17. The memory controller of claim 12, wherein each of the plurality of first buffers and each of the plurality of second buffers is associated with a logical unit (LUN) of the plurality of memory devices.

* * * * *